(12) United States Patent
Chung

(10) Patent No.: US 11,229,878 B2
(45) Date of Patent: Jan. 25, 2022

(54) DRY AIR GENERATION APPARATUS, DRY AIR GENERATION METHOD, AND SUBSTRATE PROCESSING SYSTEM

(71) Applicant: TOKYO ELECTRON LIMITED, Tokyo (JP)

(72) Inventor: Jun Young Chung, Hwaseong-si (KR)

(73) Assignee: TOKYO ELECTRON LIMITED, Tokyo (JP)

(*) Notice: Subject to any disclaimer, the term of this patent is extended or adjusted under 35 U.S.C. 154(b) by 181 days.

(21) Appl. No.: 16/582,082

(22) Filed: Sep. 25, 2019

(65) Prior Publication Data

US 2020/0096218 A1    Mar. 26, 2020

(30) Foreign Application Priority Data

Sep. 25, 2018   (JP) .............................. JP2018-178807

(51) Int. Cl.
| | |
|---|---|
| *B01D 53/26* | (2006.01) |
| *F24F 11/84* | (2018.01) |
| *F28D 7/00* | (2006.01) |
| *H01L 21/67* | (2006.01) |
| *F28D 21/00* | (2006.01) |

(52) U.S. Cl.
CPC ............ *B01D 53/265* (2013.01); *F24F 11/84* (2018.01); *F28D 7/0091* (2013.01); *F28D 2021/0038* (2013.01); *H01L 21/67017* (2013.01); *H01L 21/67109* (2013.01); *H01L 21/67248* (2013.01)

(58) Field of Classification Search
CPC ........ B01D 53/265; F24F 3/14; F24F 3/4005; F24F 11/41; F24F 11/84; F24F 2003/144; F24F 2003/1446; F28D 7/0091; H01L 21/67017; H01L 21/67109; H01L 21/67248

See application file for complete search history.

(56) References Cited

U.S. PATENT DOCUMENTS

| | | | | |
|---|---|---|---|---|
| 2,481,348 A | * | 9/1949 | Ringquist ............. | F24F 5/0007 62/151 |
| 5,497,823 A | * | 3/1996 | Davis .................... | F24F 12/001 165/231 |
| 5,890,368 A | * | 4/1999 | Lakdawala ........... | F24F 3/1405 62/81 |
| 6,021,644 A | * | 2/2000 | Ares ..................... | F24F 3/1405 62/151 |

(Continued)

FOREIGN PATENT DOCUMENTS

JP         2002-066250 A      3/2002

*Primary Examiner* — Eric S Ruppert
*Assistant Examiner* — Hans R Weiland
(74) *Attorney, Agent, or Firm* — Weihrouch IP

(57) ABSTRACT

A dry air generation apparatus includes a first heat exchanger, a second heat exchanger, a switching valve, and a controller. The first heat exchanger and the second heat exchanger are provided in the air flow path, and the moisture contained in the air is removed by cooling the air which flows through the flow path to 0° C. or lower. The switching valve switches the direction of the air flowing through the first heat exchanger and the second heat exchanger. The controller controls the first heat exchanger, the second heat exchanger, and the switching valve. The first heat exchanger and the second heat exchanger are connected in series in the air flow path.

12 Claims, 16 Drawing Sheets

(56) References Cited

U.S. PATENT DOCUMENTS

| | | | |
|---|---|---|---|
| 2001/0038988 A1* | 11/2001 | Oda | H01L 21/67109 432/5 |
| 2005/0227503 A1* | 10/2005 | Reitinger | H01L 21/67109 438/795 |
| 2008/0127508 A1* | 6/2008 | Ohno | H01L 21/67051 34/552 |
| 2009/0038326 A1* | 2/2009 | Matsui | F24F 3/1411 62/271 |
| 2009/0205354 A1* | 8/2009 | Brown | F24F 3/1405 62/324.5 |
| 2009/0283034 A1* | 11/2009 | Natsuhara | H01L 21/67109 118/500 |
| 2012/0012285 A1* | 1/2012 | Okamoto | F24F 3/153 165/110 |
| 2014/0250930 A1* | 9/2014 | Unezaki | F24F 3/1405 62/151 |
| 2016/0056032 A1* | 2/2016 | Baldasseroni | H01L 21/02274 438/778 |
| 2018/0240690 A1* | 8/2018 | Chito | H01L 21/67132 |
| 2020/0182500 A1* | 6/2020 | Ha | F24F 3/1405 |
| 2020/0240663 A1* | 7/2020 | Gustavsson | F24F 11/65 |

* cited by examiner

DRY AIR GENERATION APPARATUS, DRY AIR GENERATION METHOD, AND SUBSTRATE PROCESSING SYSTEM

CROSS-REFERENCE TO RELATED APPLICATIONS

This application is based on and claims priority from Japanese Patent Application No. 2018-178807, filed on Sep. 25, 2018 with the Japan Patent Office, the disclosure of which is incorporated herein in its entirety by reference.

TECHNICAL FIELD

Various aspects and embodiments of the present disclosure relate to a dry air generation apparatus, a dry air generation method, and a substrate processing system.

BACKGROUND

In a processing apparatus that performs a processing such as, for example, a film formation, etching, or modification on a semiconductor wafer (hereinafter, referred to as a "wafer"), the temperature of a wafer under processing is maintained at a temperature within a predetermined range. When the processing is performed using, for example, plasma, the wafer may be heated. Therefore, in order to maintain the temperature of the wafer being processed within a predetermined range, it is necessary to cool the wafer. For example, a coolant having a temperature (e.g., 0° C. or less) lower than room temperature (e.g., 20° C. to 25° C.) is circulated inside a stage on which a wafer is placed, thereby cooling the wafer through the stage.

There may be a case where dew condensation occurs on components that come in contact with the outside air, such as, for example, a stage and a coolant pipe, through which a coolant having a temperature lower than room temperature flows.

When condensation occurs on a component, the component or an electric circuit connected to the component may break down due to the moisture generated by the dew condensation. Therefore, for a component that may come in contact with the outside air among the component that is cooler than the room temperature, the dew condensation of the component is suppressed by covering the component with a container and filling the container with dry air having a low dew point temperature.

As a method of generating dry air filled in the container, for example, a membrane method that removes moisture from the air by making the air pass through a hollow fiber membrane, or a cold trap method that removes the moisture from the air by cooling air is known. The cold trap method is frequently employed as a dry air generation method since it is advantageous in that an air loss is less than that in the membrane method, and in that it is possible to generate dry air having a dew point temperature lower than that in the membrane method. See, for example, Japanese Patent Laid-Open Publication No. 2002-066250.

SUMMARY

An aspect of the present disclosure is a dry air generation device, which includes a first heat exchanger, a second heat exchanger, a switching valve, and a control device. The first heat exchanger and the second heat exchanger are provided in the air flow path, and the moisture contained in air is removed by cooling the air which flows through the air flow path to 0° C. or lower. The switching valve switches the direction of the air flowing through the first heat exchanger and the second heat exchanger. The control device controls the first heat exchanger, the second heat exchanger, and the switching valve. The first heat exchanger and the second heat exchanger are connected in series in the air flow path.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawings, which form a part thereof. The illustrative embodiments described in the detailed description, drawings, and claims are not meant to be limiting. Other embodiments may be utilized, and other changes may be made without departing from the spirit or scope of the subject matter presented here.

Hereinafter, embodiments of a dry air generation apparatus, a dry air generation method, and a substrate processing system disclosed in the present application will be described in detail with reference to the accompanying drawings. In addition, the technique of the present disclosure is not limited by the embodiments described below.

When producing dry air having a dew point temperature of 0° C. or lower by a cold trap method, the moisture contained in the air is condensed by cooling the air to 0° C. or lower by the heat exchanger. In addition, dry air is generated by separating the condensed moisture from air. However, the condensed moisture becomes ice in an environment of 0° C. or lower and adheres to the air flow path in the heat exchanger. When ice adheres to the air flow path in the heat exchanger, the heat exchange efficiency of the heat exchanger decreases. This makes it difficult to generate dry air having a desired dew point temperature.

Therefore, when the heat exchange efficiency of the heat exchanger decreases due to the adhesion of ice, it is necessary to stop the operation of the heat exchanger and restore the heat exchange efficiency of the heat exchanger by melting the ice in the heat exchanger. However, since the dry air cannot be generated while the ice in the heat exchanger is being melted, it is difficult to suppress dew condensation on the components. Accordingly, the present disclosure provides a technique capable of continuously generating dry air having a dew point temperature of 0° C. or lower.

First Embodiment

[Substrate Processing System 1]

Figure 1:
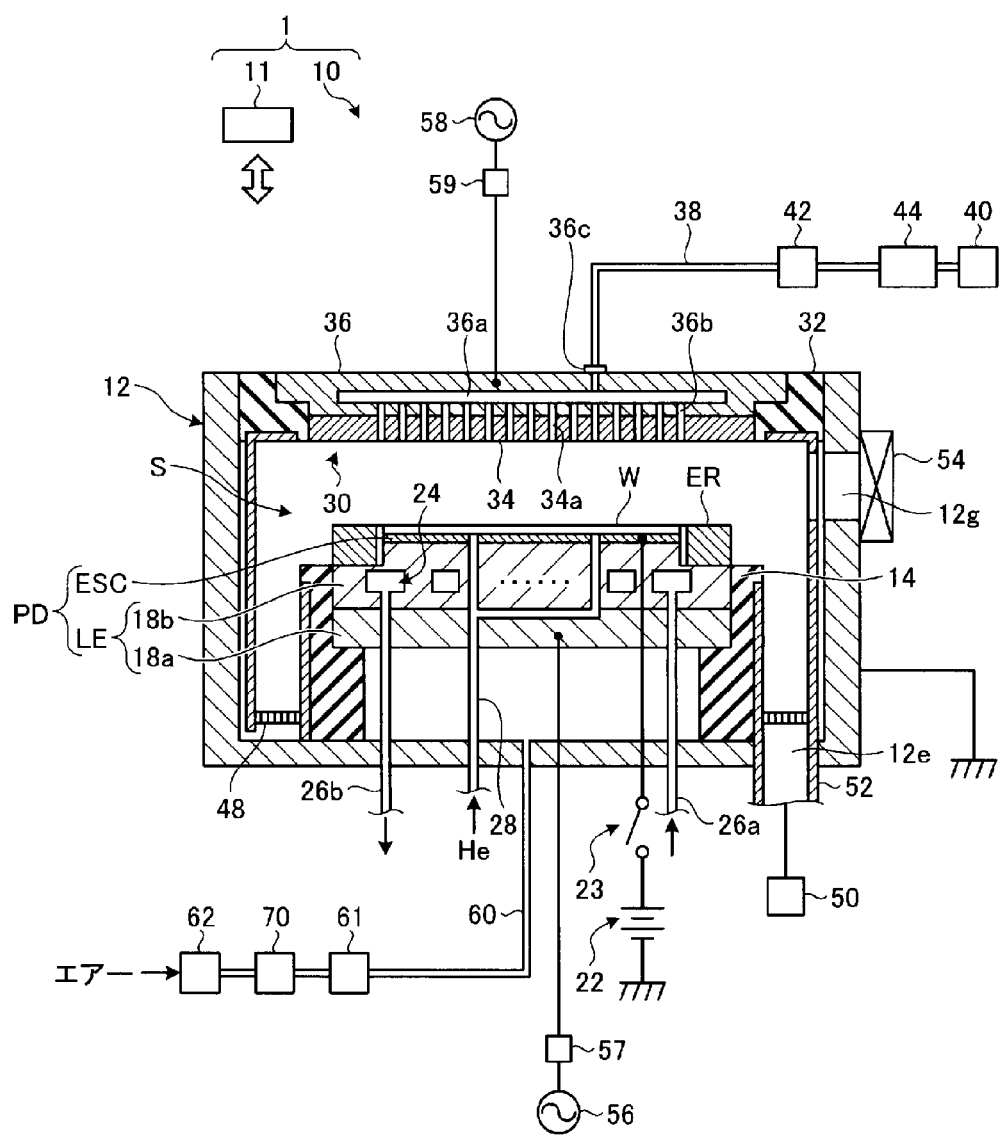
FIG. 1 is a view illustrating an exemplary substrate processing system according to an embodiment of the present disclosure.

FIG. 1 is a view illustrating an exemplary substrate processing system 1 according to an embodiment of the present disclosure. The substrate processing system 1 is installed, for example, inside a clean room. The substrate processing system 1 includes a substrate processing apparatus 10 and a control device 11. For example, as illustrated in FIG. 1, the substrate processing apparatus 10 is a plasma etching apparatus including parallel plate electrodes, and includes a processing container 12. The processing container 12 is formed, for example, of aluminum in a substantially cylindrical shape. The inner wall surface of the processing container 12 is anodized. The processing container 12 is securely grounded.

On the bottom portion of the processing container 12, a support member 14 formed in a substantially cylindrical shape by, for example, an insulating material, is provided. In addition, a stage PD is provided in the processing container 12. The stage PD is supported by the support member 14. A space surrounded by the lower surface of the stage PD, the inner wall of the support member 14, and the bottom portion of the processing container 12 is formed below the stage PD. The stage PD holds a wafer W on the upper surface thereof.

The stage PD includes a lower electrode LE and an electrostatic chuck ESC. The lower electrode LE includes a first plate 18a and a second plate 18b formed in a substantially disc shape from a metal material such as, for example, aluminum. The second plate 18b is provided on the first plate 18a, and is electrically connected to the first plate 18a. An electrostatic chuck ESC is provided on the second plate 18b. In addition, the stage PD is provided with a pipe 28 for supplying a heat transfer gas such as, for example, He gas between the upper surface of the electrostatic chuck ESC and the rear surface of the wafer W.

The electrostatic chuck ESC has a structure in which an electrode which is a conductive film is disposed between a pair of insulating layers or between a pair of insulating sheets. A direct current (DC) power supply 22 is electrically connected to the electrode of the electrostatic chuck ESC via a switch 23. The electrostatic chuck ESC attracts the wafer W by an electrostatic force such as, for example, a Coulomb force generated by a DC voltage from the DC power supply 22. On the peripheral edge portion of the second plate 18b, a focus ring FR is disposed to surround the edge of the wafer W and the electrostatic chuck ESC.

A flow path 24 through which the coolant controlled to have a temperature of, for example, 0° C. or lower is formed inside the second plate 18b. A chiller unit (not illustrated) is connected to the flow path 24 via a pipe 26a and a pipe 26b. A coolant controlled to have a temperature of 0° C. or lower is supplied from the chiller unit to the flow path 24 through the pipe 26a. The coolant circulating in the coolant flow path 24 is returned to the chiller unit through the pipe 26b. As the coolant flows in the flow path 24, the second plate 18b is cooled, and the wafer W held by the electrostatic chuck ESC is cooled via the electrostatic chuck ESC which is in contact with the second plate 18b.

In addition, the first plate 18a which is in contact with the second plate 18b is also cooled to a temperature lower than room temperature. Therefore, dew condensation may occur on the lower surface of the first plate 18a that comes into contact with the outside air. Therefore, in this embodiment, the lower space in the substrate processing apparatus 10a which faces the first plate 18a is filled with dry air having a temperature lower than the temperature of the coolant flowing in the flow path 24 of the second plate 18b through the pipe 60 (described later). This suppresses the dew condensation of the components facing the space below the first plate 18a. The first plate 18a is an example of a low-temperature member.

An upper electrode 30 is provided above the stage PD to face the stage PD. The lower electrode LE and the upper electrode 30 are provided substantially parallel to each other. Hereinafter, the space between the lower electrode LE and the upper electrode 30 is referred to as a processing space S. The upper electrode 30 is supported in the upper portion of the processing container 12 via an insulative blocking member 32.

The upper electrode 30 includes an electrode plate 34 and an electrode support 36. The electrode plate 34 faces the processing space S, and the electrode plate 34 is provided with a plurality of gas ejection ports 34a. The electrode support 36 is made of a conductive material such as, for example, aluminum, and supports the electrode plate 34 in a detachable manner Inside the electrode support 36, a gas diffusion chamber 36a is provided. In addition, a plurality of gas flow ports 36b are provided in the lower surface of the electrode support 36, and each gas flow ports 36b connect the gas diffusion chamber 36a to the gas ejection ports 34a, respectively.

The electrode support 36 is provided with a gas inlet 36c configured to guide a processing gas to the gas diffusion chamber 36a, and a pipe 38 is connected to the gas inlet 36c. To the pipe 38, a gas source group 40 is connected via a valve 42 and a flow rate controller 44. In the example of FIG. 1, one gas supply source 40, one valve 42, and one flow controller 44 are illustrated, but each of the gas supply source 40, the valve 42, and the flow controller 44 may be provided for each type of gas used for processing.

A baffle plate 48 is provided in the bottom portion of the processing container 12 between the support member 14 and the side wall of the processing container 12. An exhaust port 12e is provided below the exhaust duct 48. An exhaust apparatus 50 is connected to the exhaust port 12e via an exhaust pipe 52. The exhaust apparatus 50 has a vacuum pump such as, for example, a turbo molecular pump, and is capable of decompressing the space inside the processing container 12 to a desired degree of vacuum. An opening 12g for loading/unloading a wafer W therethrough is provided in the sidewall of the processing container 12, and the opening 12g is configured to be opened/closed by a gate valve 54.

The substrate processing apparatus 10 includes a radio-frequency power supply 56 and a radio-frequency power supply 58. The radio-frequency power supply 58 is a power supply that generates first radio-frequency power for plasma generation. The radio-frequency power supply 58 generates radio-frequency power of 27 MHz to 100 MHz, for example, 60 MHz. The radio-frequency power supply 58 is connected to the upper electrode 30 via a matcher 59. The matcher 59 is a circuit configured to match the output impedance of the radio-frequency power supply 58 and the load side (the upper electrode 30 side) input impedance.

The radio-frequency power supply 56 is a power supply configured to generate second radio-frequency power for drawing ions into a wafer W, that is, radio-frequency bias power. The radio-frequency power supply 56 generates radio-frequency power in the range of 400 kHz to 40.68 MHz, for example, 13.56 MHz. The radio-frequency power supply 56 is connected to the lower electrode LE via a matcher 57. The matcher 57 is a circuit configured to match the output impedance of the radio-frequency power supply 56 and the load side (lower electrode LE side) input impedance.

A flow rate controller 61, an air dryer 70, and a regulator 62 are connected to the bottom portion of the processing container 12 via a pipe 60. The regulator 62 takes in air at room temperature supplied into the clean room where the substrate processing system 1 is installed, and adjusts the pressure of the taken-in air. The room temperature is, for example, 20° C. to 25° C. The regulator 62 supplies the air having an adjusted pressure to the air inlet of the air dryer 70. In addition, the regulator 62 may take in dry air supplied into the clean room.

The air dryer 70 generates dry air having a low dew point temperature by removing moisture from the air taken in by the regulator 62. The air dryer 70 supplies the generated dry air to the flow rate controller 61 from the air outlet thereof. The air dryer 70 is an example of a dry air generation apparatus.

The flow rate controller 61 adjusts the flow rate of the dry air generated by the air dryer 70. Then, the flow rate controller 61 fills the space surrounded by the lower surface of the first plate 18 a, the inner wall of the support member 14, and the bottom portion of the processing container 12 with the dry air of which the flow rate is adjusted through the pipe 60. This suppresses dew condensation on, for example, the lower surface of the first plate 18a.

The control device 11 has memory, a processor, and an input/output interface. The processor of the control device 11 controls each unit of the substrate processing apparatus 10 via the input/output interface by reading and executing a program stored in the memory.

[Configuration of Air Dryer 70]

Figure 2:
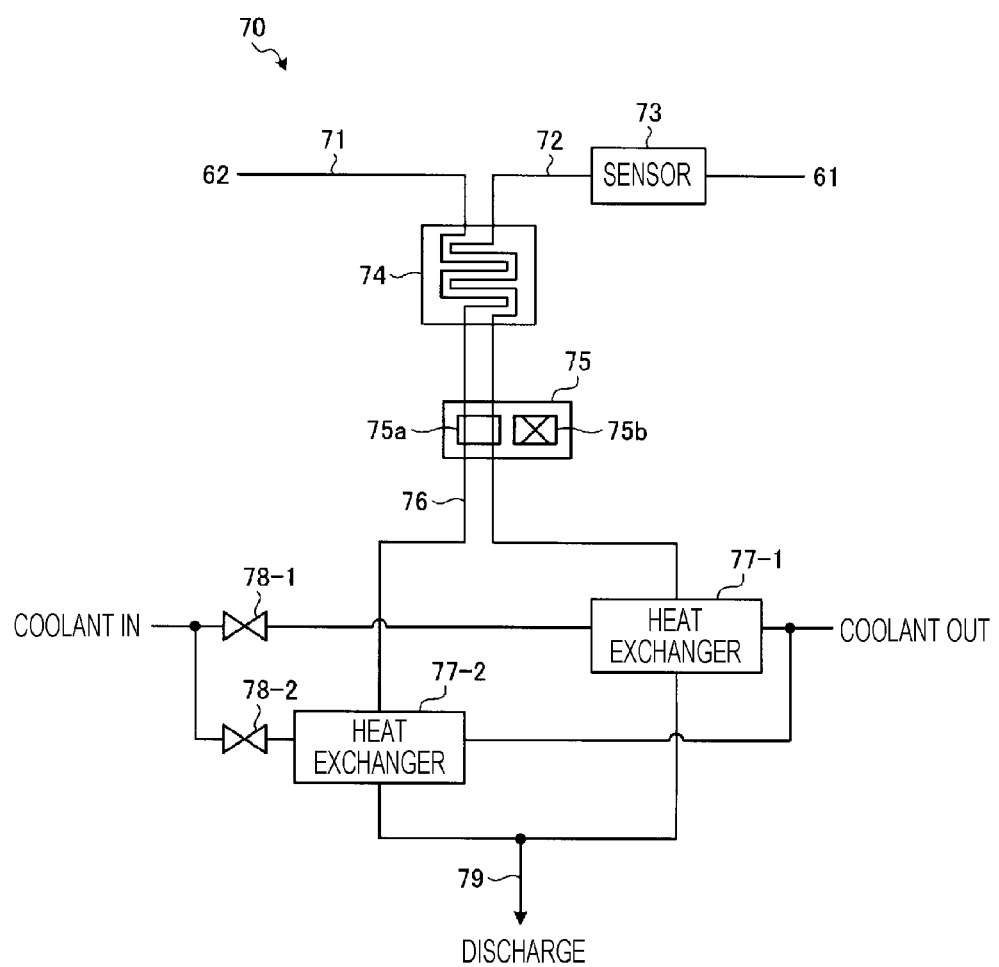
FIG. 2 is a block diagram illustrating an exemplary air dryer according to a first embodiment of the present disclosure.

FIG. 2 is a block diagram illustrating an exemplary air dryer 70 according to a first embodiment of the present disclosure. The air dryer 70 in this embodiment includes a pipe 71, a pipe 72, a sensor 73, a heat exchanger 74, a switching valve 75, a pipe 76, a heat exchanger 77-1, a heat exchanger 77-2, and a first valve 78-1, a second valve 78-2, and a drain pipe 79.

The pipe 71 is connected to an air inlet of the air dryer 70, and supplies the air supplied from the regulator 62 to the heat exchanger 74. The pipe 72 is connected to a dry air outlet of the air dryer 70, and supplies the dry air that has flowed out through the heat exchanger 74 to the flow rate controller 61. The pipe 71 is an example of a first pipe, and the pipe 72 is an example of a second pipe.

The sensor 73 is provided in the pipe 72, and monitors the state of the dry air flowing in the pipe 72. In this embodiment, the sensor 73 is, for example, a dew point temperature sensor, and measures the dew point temperature of the dry air flowing in the pipe 72. Information on the dew point temperature of the dry air measured by the sensor 73 is output to the control device 11.

The heat exchanger 74 exchanges heat between the air supplied from the regulator 62 and the dry air generated by at least one of the heat exchangers 77-1 and 77-2. This enables the air supplied from the regulator 62 to be pre-cooled, and the cooling efficiency of the air in the heat exchanger 77-1 and the heat exchanger 77-2 to be increased. In addition, it is possible to suppress a decrease in the temperature of the dry air output from the air dryer 70. The heat exchanger 74 is an example of a third heat exchanger. A heater may be provided in the pipe 72 in order to raise the temperature of the dry air output from the air dryer 70.

The heat exchanger 74 exchanges heat between the air supplied from the regulator 62 and the dry air generated by at least one of the heat exchangers 77-1 and 77-2. This enables the air supplied from the regulator 62 to be pre-cooled, and the cooling efficiency of the air in the heat exchanger 77-1 and the heat exchanger 77-2 to be increased. In addition, it is possible to suppress a decrease in the temperature of the dry air output from the air dryer 70. The heat exchanger 74 is an example of a third heat exchanger. A heater may be provided in the pipe 72 in order to raise the temperature of the dry air output from the air dryer 70.

The heat exchanger 77-1 is provided on one end side of the pipe 76, and the heat exchanger 77-2 is provided on the other end side of the pipe 76. The heat exchanger 77-1 and the heat exchanger 77-2 are connected in series in the air flow path in the pipe 76. The wording "connected in series" means that the heat exchanger 77-1 and the heat exchanger 77-2 are connected to each other such that the air that has flown in the heat exchanger 77-1 flows in the heat exchanger 77-2, and the air that has flown in the heat exchanger 77-2 flows in the heat exchanger 77-1. Therefore, in the first connection state, the air that has passed through the heat exchanger 77-2 then passes through the heat exchanger 77-1. Meanwhile, in the second connection state, the air that has passed through the heat exchanger 77-1 then passes through the heat exchanger 77-2. The heat exchanger 77-1 is an example of a first heat exchanger, and the heat exchanger 77-2 is an example of a second heat exchanger.

A coolant having a temperature of 0° C. or lower is supplied to the heat exchanger 77-1 from a chiller unit (not illustrated) via a first valve 78-1. The coolant that has passed through the heat exchanger 77-1 is returned to the chiller unit. The heat exchanger 77-1 cools the air supplied from the regulator 62 with the coolant supplied via the first valve 78-1, thereby condensing moisture from the air. Then, the heat exchanger 77-1 generates dry air by separating the condensed moisture and air. The condensed moisture is discharged through the pipe 76 and the drain pipe 79.

A coolant having a temperature of 0° C. or lower is supplied to the heat exchanger 77-2 from a chiller unit (not illustrated) via a second valve 78-2, and the coolant that has passed through the heat exchanger 77-2 is returned to the chiller unit. The heat exchanger 77-2 cools the air supplied from the regulator 62 with the coolant supplied via the second valve 78-2, thereby condensing moisture contained in the air. Then, the heat exchanger 77-2 generates dry air by separating the condensed moisture and air. The condensed moisture is discharged through the pipe 76 and the drain pipe 79.

In this embodiment, the temperature of the coolant supplied to the heat exchanger 77-1 and the heat exchanger 77-2 is −50° C. or lower. This enables the heat exchanger 77-1 and the heat exchanger 77-2 to generate dry air having a dew point temperature of −50° C. or lower. The supply and supply stop of the coolant with respect to the heat exchanger 77-1 by the first valve 78-1 and the supply and supply stop of the coolant with respect to the heat exchanger 77-2 by the second valve 78-2 are controlled by the control device 11.

The drain pipe 79 is connected to the pipe 76 between the heat exchanger 77-1 and the heat exchanger 77-2. The heat exchanger 77-1 and the heat exchanger 77-2 are disposed at a position higher than the drain pipe 79. The water removed from the air by the heat exchanger 77-1 and the heat exchanger 77-2 flows through the pipe 76 between the heat exchanger 77-1 and the heat exchanger 77-2 and is discharged from the drain pipe 79.

[Dry Air Generation Method]

Figure 3:
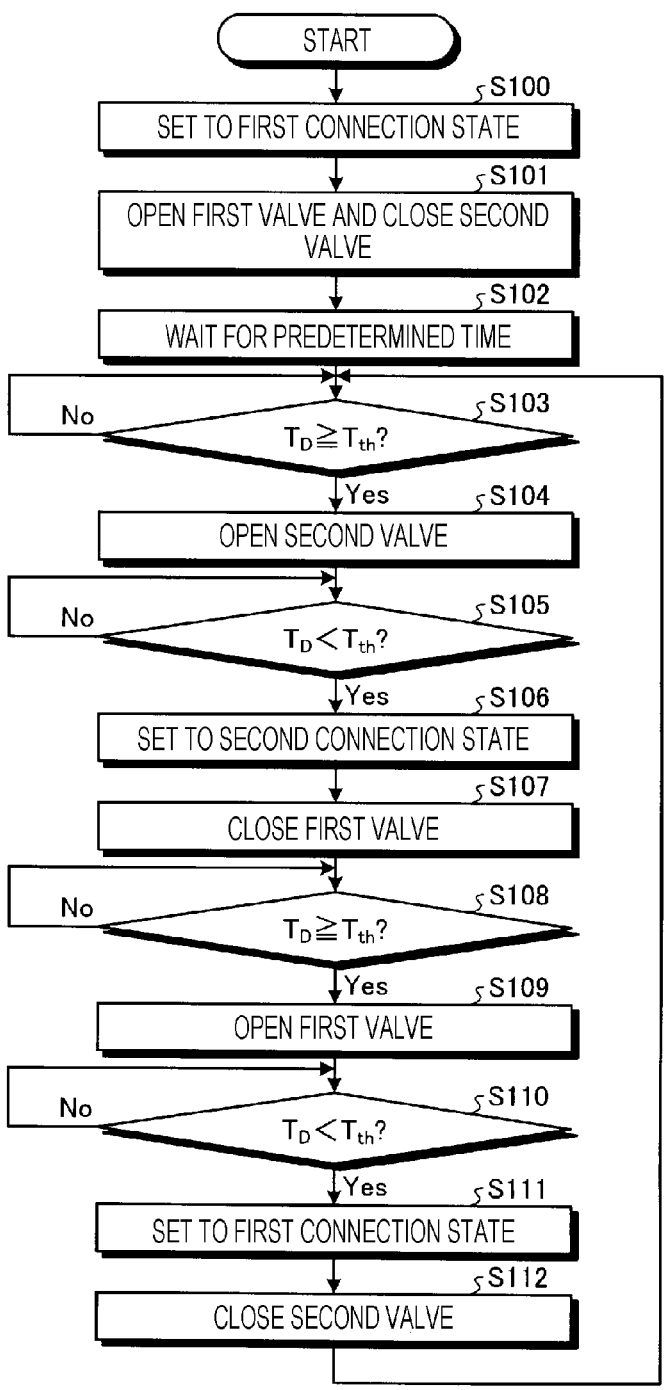
FIG. 3 is a flowchart illustrating an exemplary dry air generation method according to the first embodiment of the present disclosure.

FIG. 3 is a flowchart illustrating an exemplary dry air generation method according to the first embodiment of the present disclosure. The processings illustrated in the flowchart of FIG. 3 is controlled by the control device 11. In the following, the state of each valve will be described with reference to FIGS. 4 to 7.

First, the control device 11 controls the switching valve 75 to set the switching valve 75 to the first connection state (S100). Then, the control device 11 opens the first valve 78-1 and closes the second valve 78-2 (S101). When the first valve 78-1 is opened, the coolant is supplied to the heat exchanger 77-1, and the heat exchanger 77-1 starts operation. Since the second valve 78-2 is closed, no coolant is supplied to the heat exchanger 77-2, and the heat exchanger 77-2 is stopped. Then, the control device 11 waits for a predetermined time until the heat exchange efficiency by the heat exchanger 77-1 is stabilized (S102).

Figure 4:
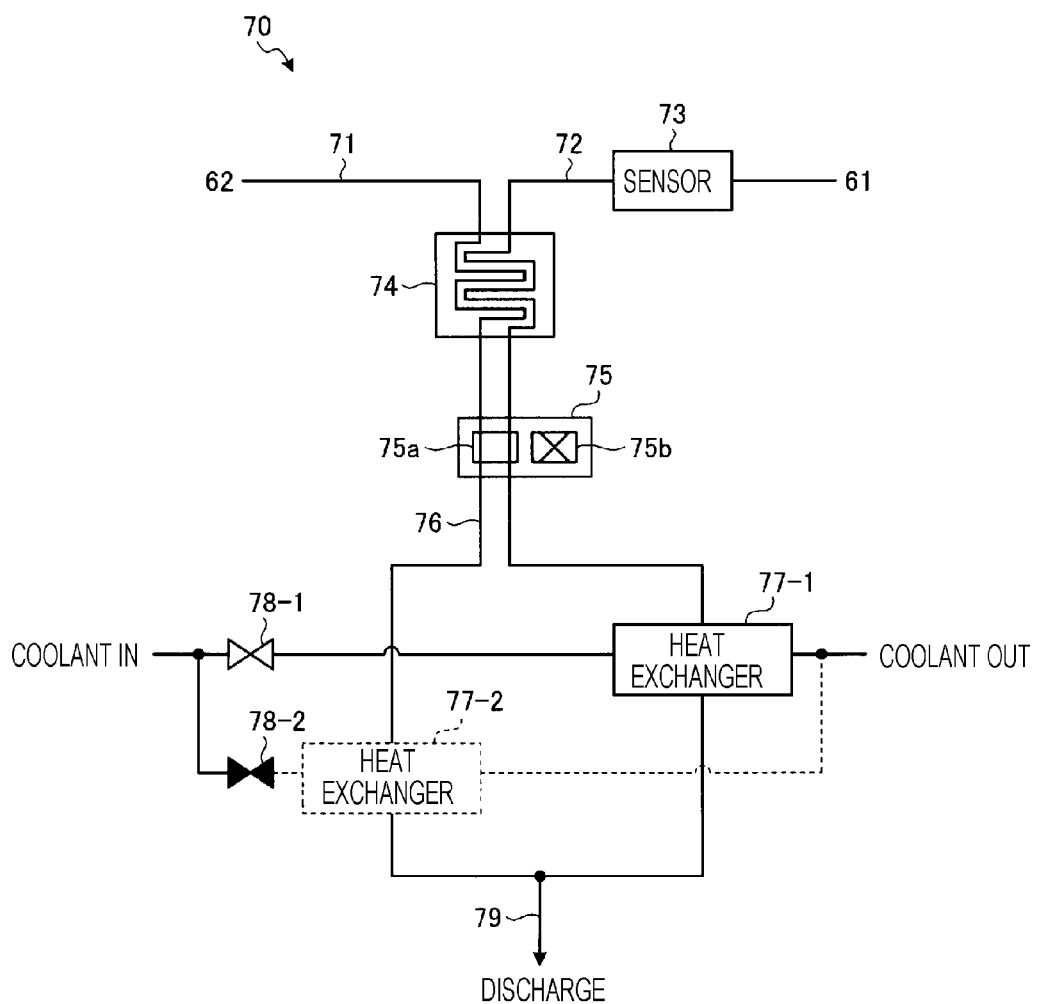
FIG. 4 is a view illustrating an exemplary state of each valve.

The state of each valve at this time is, for example, as illustrated in FIG. 4. In the first valve 78-1 and the second valve 78-2, the opened valve is drawn in white, and the closed valve is drawn in black. The air supplied from the regulator 62 is supplied to the heat exchanger 77-1 via the pipe 71, the heat exchanger 74, the connection block 75a of the switching valve 75, and the heat exchanger 77-2. Then, the air is cooled by the heat exchanger 77-1. Therefore, the moisture contained in the air is removed so that dry air is generated. The generated dry air flows to the heat exchanger 74 through the connection block 75a of the switching valve 75.

In the heat exchanger 74, heat exchange is performed between the room temperature air flowing in from the regulator 62 and the dry air cooled by the heat exchanger 77-1. As a result, the air supplied from the regulator 62 is precooled, and the air is capable of being efficiently cooled by the heat exchanger 77-1. The dry air heat-exchanged with the air supplied from the regulator 62 by the heat exchanger 74 is supplied to the flow rate controller 61 via the pipe 72. The dew point temperature of the air flowing through the pipe 72 is measured by the sensor 73.

Here, when the operation of the heat exchanger 77-1 continues, the moisture removed from the air adheres to the air flow path in the heat exchanger 77-1 as ice, and the heat exchange efficiency of the heat exchanger 77-1 gradually decreases. This makes the dew point temperature of the dry air flowing through the pipe 72 gradually increase.

Next, the control device 11 determines whether or not the heat exchange efficiency of the heat exchanger 77-1 becomes equal to or lower than predetermined heat exchange efficiency by determining whether or not the dew point temperature $T_D$ of the dry air measured by the sensor 73 becomes equal to or higher than a predetermined threshold value $T_{Th}$ (S103). The threshold value $T_{Th}$ is a temperature lower than the allowable dew point temperature required for dry air. For example, when the allowable dew point temperature required for dry air is −40° C., the threshold value $T_{Th}$ is, for example, −50° C. When the dew point temperature $T_D$ is lower than the threshold value $T_{Th}$ (S103: No), the control device 11 executes the processing of step S103 again.

Figure 5:
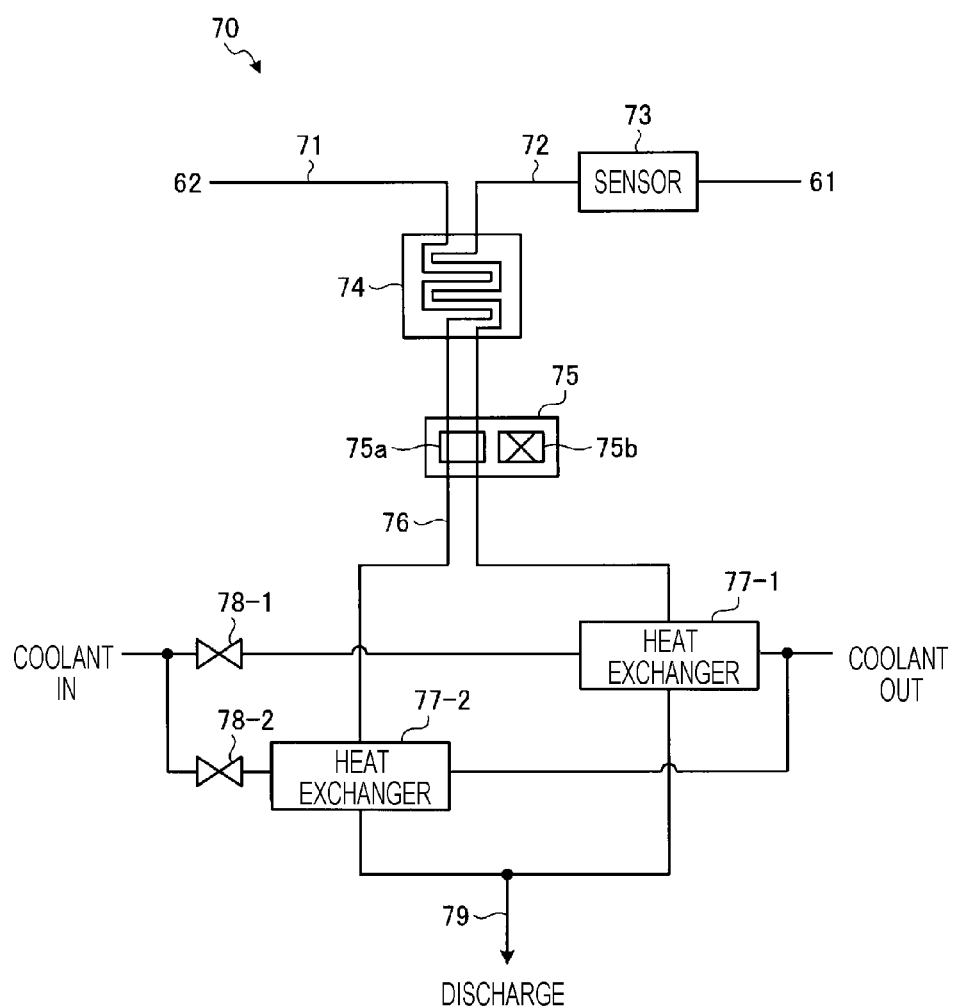
FIG. 5 is a view illustrating an exemplary state of each valve.

Meanwhile, when the dew point temperature $T_D$ becomes equal to or higher than the threshold value $T_{Th}$ (S103: Yes), that is, when the heat exchange efficiency of the heat exchanger 77-1 becomes equal to or lower than the predetermined efficiency, the control device 11 operates the heat exchanger 77-2 by opening the second valve 78-2 (S104). Thus, the state of each valve becomes, for example, as illustrated in FIG. 5. In the example of FIG. 5, both the first valve 78-1 and the second valve 78-2 are opened, and both the heat exchanger 77-1 and the heat exchanger 77-2 are operating. When the heat exchanger 77-2 starts operation, the dew point temperature of the dry air flowing through the pipe 72 starts to decrease. Thus, by operating both the heat exchanger 77-1 and the heat exchanger 77-2 for a predetermined time, it is possible to prevent dry air having a high dew point temperature from being supplied to the flow rate controller 61 until the heat exchange efficiency of the heat exchanger 77-2 is stabilized.

Next, the control device 11 determines whether or not the dew point temperature $T_D$ of the dry air measured by the sensor 73 is lower than the threshold value $T_{Th}$ (S105). When the dew point temperature $T_D$ is equal to or higher than the threshold value $T_{Th}$ (S105: No), the control device 11 executes the processing of step S105 again.

Meanwhile, when the dew point temperature $T_D$ is lower than the threshold value $T_{Th}$ (S105: Yes), the control device 11 controls the switching valve 75 to set the switching valve 75 to the second connection state (S106). Then, the control device 11 stops the heat exchanger 77-1 by closing the first valve 78-1 (S107). Therefore, dry air is generated by the heat exchanger 77-2.

Figure 6:
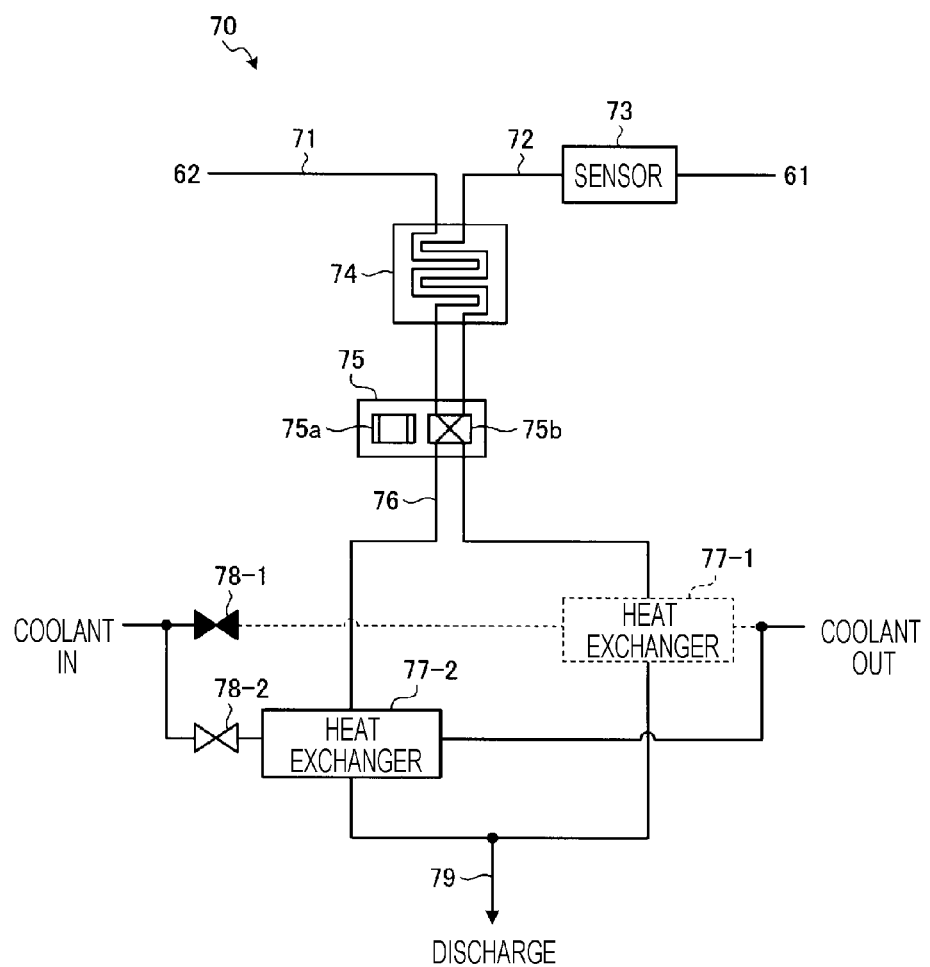
FIG. 6 is a view illustrating an exemplary state of each valve.

The state of each valve at this time is, for example, as illustrated in FIG. 6. By setting the switching valve 75 to the second connection state, the air supplied from the regulator 62 is supplied to the air flow path in the heat exchanger 77-1. Since the heat exchanger 77-1 is stopped, the room temperature air supplied from the regulator 62 melts the ice that has adhered to the air flow path in the heat exchanger 77-1 to form liquid water. The water that has become liquid in the air flow path in the heat exchanger 77-1 flows to the drain pipe 79 through the pipe 76 between the heat exchanger 77-1 and the heat exchanger 77-2, and is discharged from the drain pipe 79. This enables the heat exchange efficiency of the heat exchanger 77-1 to be recovered.

In addition, since the switching valve 75 is set to the second connection state, the dry air from which moisture has been removed by the heat exchanger 77-2 flows to the switching valve 75 through the pipe 76 between the heat exchanger 77-2 and the switching valve 75. Therefore, the liquid water that has flown out from the air flow path in the heat exchanger 77-1 is discharged without coming into contact with the dry air generated by the heat exchanger 77-2. This enables the dew point temperature of the dry air generated by the heat exchanger 77-2 to be kept low.

Next, the control device 11 determines whether or not the heat exchange efficiency of the heat exchanger 77-2 becomes equal to or lower than the predetermined heat exchange efficiency by determining whether or not the dew point temperature $T_D$ of the dry air measured by the sensor 73 becomes equal to or higher than the threshold value $T_{Th}$ (S108). When the dew point temperature $T_D$ is lower than the threshold value $T_{Th}$ (S108: No), the control device 11 executes the processing of step S108 again.

Figure 7:
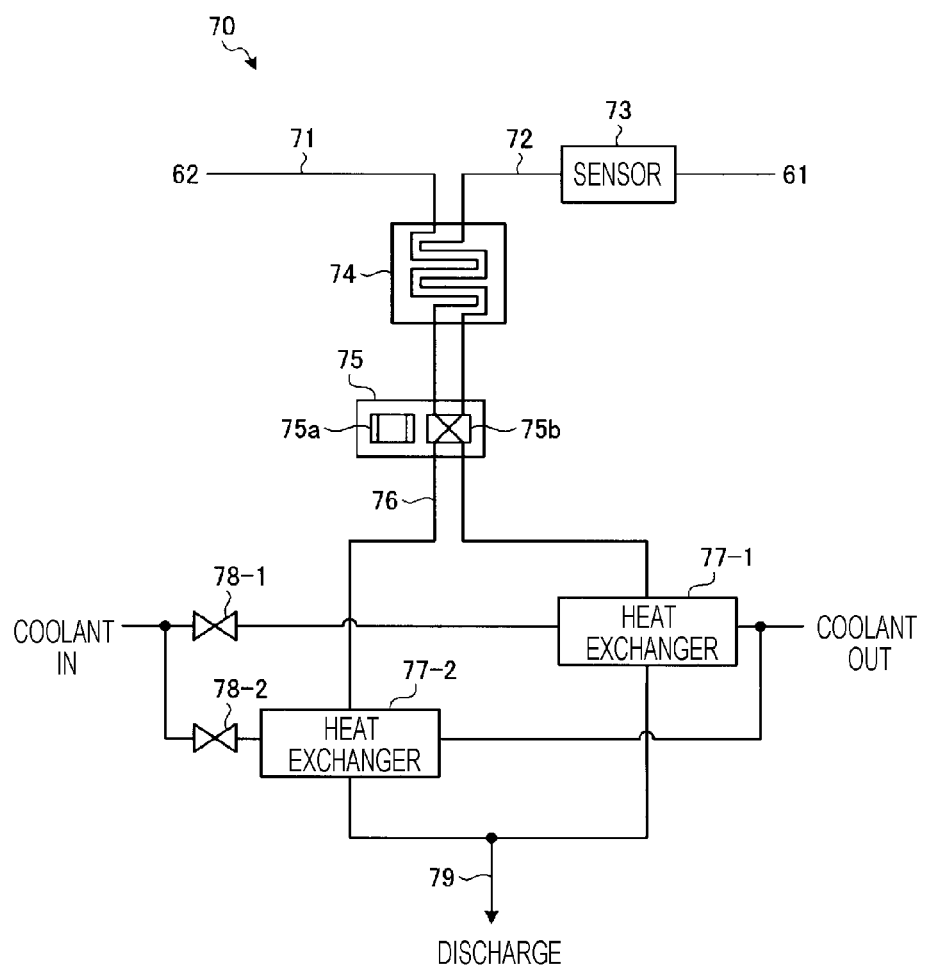
FIG. 7 is a view illustrating an exemplary state of each valve.

Meanwhile, when the dew point temperature $T_D$ is equal to or higher than the threshold value $T_{Th}$ (S108: Yes), that is, when the heat exchange efficiency of the heat exchanger 77-2 is equal to or lower than the predetermined efficiency, the control device 11 operates the heat exchanger 77-1 again by opening the first valve 78-1 again (S109). Thus, the state of each valve becomes, for example, as illustrated in FIG. 7. By operating again the heat exchanger 77-1 of which the heat exchange efficiency has recovered, the dew point temperature of the dry air flowing through the pipe 72 starts to decrease again.

Next, the control device 11 determines whether or not the dew point temperature $T_D$ of the dry air measured by the sensor 73 is lower than the threshold value $T_{Th}$ (S110). When the dew point temperature $T_D$ is equal to or higher than the threshold value $T_{Th}$ (S110: No), the control device 11 executes the processing of step S110 again.

Meanwhile, when the dew point temperature $T_D$ is lower than the threshold value $T_{Th}$ (S110: Yes), the control device 11 controls the switching valve 75 to set the switching valve 75 to the first connection state (S111). Then, the control device 11 stops the heat exchanger 77-2 by closing the second valve 78-2 (S112). Therefore, dry air is generated by the heat exchanger 77-1. Then, the processing illustrated in step S103 is executed again.

The state of each valve at this time is, for example, as illustrated in FIG. 4. By setting the switching valve 75 to the first connection state, the air supplied from the regulator 62 is supplied to the air flow path in the heat exchanger 77-2. Since the heat exchanger 77-2 is stopped, the room temperature air supplied from the regulator 62 melts the ice that has adhered to the air flow path in the heat exchanger 77-2 to form liquid water. The water that has become liquid in the air flow path in the heat exchanger 77-2 flows to the drain pipe 79 through the pipe 76 between the heat exchanger 77-1 and the heat exchanger 77-2, and is discharged from the drain pipe 79. This causes the heat exchange efficiency of the heat exchanger 77-2 to be recovered.

In addition, since the switching valve 75 is set to the first connection state, the dry air from which moisture has been removed by the heat exchanger 77-1 flows to the switching valve 75 through the pipe 76 between the heat exchanger 77-1 and the switching valve 75. Therefore, the liquid water that has flown from the air flow path in the heat exchanger 77-2 is discharged without coming into contact with the dry air generated by the heat exchanger 77-1. This enables the dew point temperature of the dry air generated by the heat exchanger 77-1 to be kept low.

The substrate processing system 1 in the first embodiment has been described above. The substrate processing system 1 in this embodiment includes a stage PD, a processing container 12, a support member 14, an air dryer 70, and a flow rate controller 61. The stage PD is provided in the substrate processing apparatus 10 that processes a wafer W, and has a temperature lower than room temperature. The processing container 12 and the support member 14 surround at least a part of the stage PD and form a space. The air dryer 70 generates dry air. The flow controller 61 supplies the dry air generated by the air dryer 70 into the space formed by the processing container 12 and the support member 14. The air dryer 70 includes a heat exchanger 77-1, a heat exchanger 77-2, a switching valve 75, and a control device 11. The heat exchanger 77-1 and the heat exchanger 77-2 are provided in the air flow path, and the moisture contained in air is removed by cooling the air which flows through the flow path to 0° C. or lower. The switching valve 75 switches the direction of the air flowing in the heat exchanger 77-1 and the heat exchanger 77-2. The control device 11 controls the heat exchanger 77-1, the heat exchanger 77-2, and the switching valve 75. The heat exchanger 77-1 and the heat exchanger 77-2 are connected in series in the air flow path in the pipe 76. This enables dry air having a dew point temperature of 0° C. or lower to be continuously generated, and dew condensation of the members to be prevented.

In the above-described embodiment, when the heat exchange efficiency of the heat exchanger 77-1 is equal to or lower than the predetermined efficiency, the control device 11 stops the heat exchanger 77-1 after a predetermined time has elapsed since the heat exchanger 77-2 was operated. In addition, then the heat exchange efficiency of the heat exchanger 77-2 is equal to or lower than the predetermined efficiency, the control device 11 stops the heat exchanger 77-2 after a predetermined time has elapsed since the heat exchanger 77-1 was operated. Thus, it is possible to prevent dry air having a high dew point temperature from being supplied to the substrate processing apparatus 10 until the heat exchange efficiency of the heat exchanger that has started operating is stabilized.

Moreover, the air dryer 70 in the above-described embodiment includes a pipe 71 and a pipe 72. The pipe 71 is connected to the air inlet. The pipe 72 is connected to the air outlet. The switching valve 75 is provided between the pipe 71, the pipe 72, and one end of the flow path and the other end of the flow path. The flow path is an air flow path provided with the heat exchanger 77-1 and the heat exchanger 77-2. The heat exchanger 77-1 is provided on one end side of the flow path, and the heat exchanger 77-2 is provided on the other end side of the flow path. When operating the heat exchanger 77-1 and stopping the heat exchanger 77-2, the control device 11 controls the switching valve 75 to connect the pipe 71 and the other end of the flow path, and to connect the pipe 72 and one end of the flow path. When stopping the heat exchanger 77-1 and operating the heat exchanger 77-2, the control device 11 controls the switching valve 75 to connect the pipe 71 and the one end of the flow path, and to connect the pipe 72 and the other end of the flow path. Thus, it is possible to prevent the dry air after moisture is removed by one heat exchanger from passing through the flow path in the other heat exchanger. Moreover, when one heat exchanger is operating, it is possible to cause the air before cooling to flow into the flow path in the other heat exchanger that is being stopped. Thus, it is possible to melt the ice existing in the flow path in the other heat exchanger, and to recover the heat exchange efficiency of the other heat exchanger.

The air dryer 70 in the above-described embodiment further includes a heat exchanger 74 that performs heat exchange between the air flowing through the pipe 71 and the air flowing through the pipe 72. As a result, the air introduced from the regulator 62 is precooled, and the air is capable of being efficiently cooled by the heat exchanger 77-1 or the heat exchanger 77-2.

The air dryer 70 in the above-described embodiment further includes a sensor 73 that measures the dew point temperature of the air flowing in the pipe 72. In the state where the heat exchanger 77-1 is operating and the heat exchanger 77-2 is stopped, when the dew point temperature measured by the sensor 73 becomes equal to or higher than a predetermined temperature, the control device 11 determines that the heat exchange efficiency of the exchanger 77-1 becomes equal to or lower than a predetermined efficiency. In addition, in the state where the heat exchanger 77-1 is stopped and the heat exchanger 77-2 is operating, when the dew point temperature measured by the sensor 73 becomes equal to or higher than a predetermined temperature, the control device 11 determines that the heat exchange efficiency of the exchanger 77-2 becomes equal to or lower than a predetermined efficiency. This enables the dew point temperature of dry air to be kept below a predetermined value.

In addition, the air dryer 70 in the above-described embodiment further includes a drain pipe 79 that is connected to the flow path between the heat exchanger 77-1 and the heat exchanger 77-2 and discharges the moisture removed from the air by the heat exchanger 77-1 and the heat exchanger 77-2. Further, the heat exchanger 77-1 and the heat exchanger 77-2 are disposed at a position higher than the drain pipe 79. This enables the water removed by the heat exchanger 77-1 and the heat exchanger 77-2 to be efficiently discharged.

Second Embodiment

In the air dryer 70 of the first embodiment, dry air is continuously generated by alternately operating the two heat exchangers 77-1 and 77-2. In contrast, in this embodiment, three or more heat exchangers that generate dry air are provided and operated one by one in order. Thus, even when the time required for recovery of the heat exchange efficiency is longer than the time required for the reduction of the heat exchange efficiency, it is possible to continuously generate dry air. Therefore, it is also possible to continuously generate dry air by taking in air having a high dew point temperature in the clean room.

[Configuration of Air Dryer 70]

Figure 8:
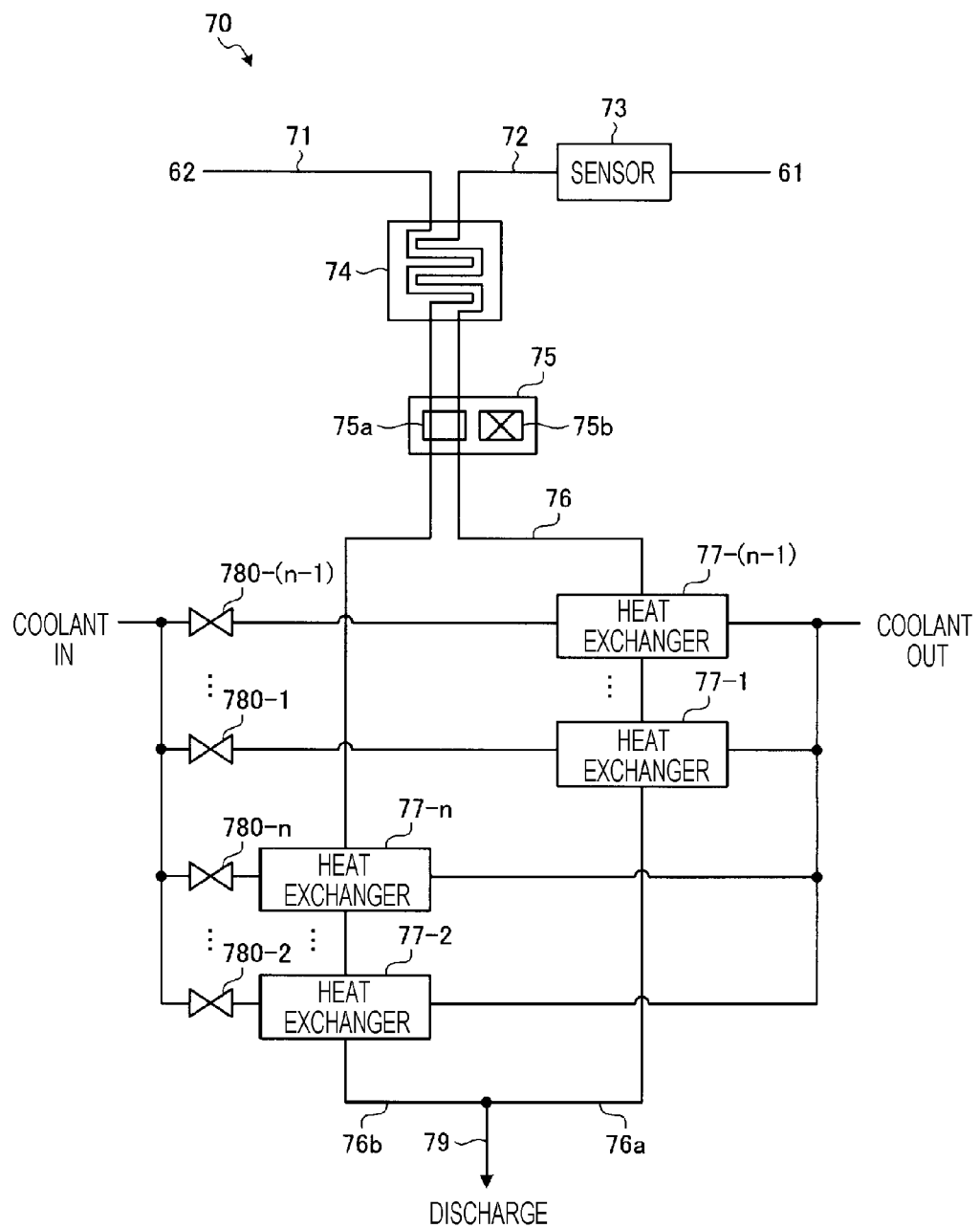
FIG. 8 is a block diagram illustrating an exemplary air dryer according to a second embodiment of the present disclosure.

FIG. 8 is a block diagram illustrating an exemplary air dryer according to the second embodiment of the present disclosure. The air dryer 70 in this embodiment includes a pipe 71, a pipe 72, a sensor 73, a heat exchanger 74, a switching valve 75, a pipe 76, a plurality of heat exchangers 77-1 to 77-n, and a plurality of valves 780-1 to 780-n. n is an integer of 3 or more. In this embodiment, n is an even number.

Except for the points described below, in FIG. 8, members denoted by the same reference numerals as those in FIG. 2 have the same or similar functions as the members in FIG. 2, and a description thereof will be omitted. The plurality of heat exchangers 77-1 to 77-n will be referred to as a heat exchanger 77 when they are collectively called without being distinguished from each other, and the plurality of valves 780-1 to 780-n will be referred to as a valve 780 when they are collectively called without being distinguished from each other. Hereinafter, the heat exchanger 77-k will be referred to as a $k^{th}$ heat exchanger 77, and the valve 780-k will be referred to as a $k^{th}$ valve 780. k is an integer of 1 to n.

In this embodiment, n heat exchangers 77 and n valves 780 are provided. The $k^{th}$ heat exchanger 77 is supplied with a coolant having a temperature of 0° C. or lower via the $k^{th}$ valve 780. The n heat exchangers 77 are connected in series in the air flow path in the pipe 76. In this embodiment, odd-numbered heat exchangers 77 are provided in the pipe 76a between the switching valve 75 and the drain pipe 79 in the pipe 76, and even-numbered heat exchangers 77 are provided in the pipe 76b between the switching valve 75 and the drain pipe 79. In this embodiment, the odd-numbered heat exchangers 77 provided in the pipe 76a will be referred to as the heat exchanger 77-1, the heat exchanger 77-3, . . . , and 77-(n−1) in order from the side closer to the drain pipe 79. In this embodiment, the even-numbered heat exchangers 77 provided in the pipe 76a will be referred to as the heat exchanger 77-2, the heat exchanger 77-4, . . . , and 77-n−1 in order from the side closer to the drain pipe 79. In this embodiment, odd-numbered heat exchangers 77 and even-numbered heat exchangers 77 operate alternately.

[Dry Air Generation Method]

Figure 9:
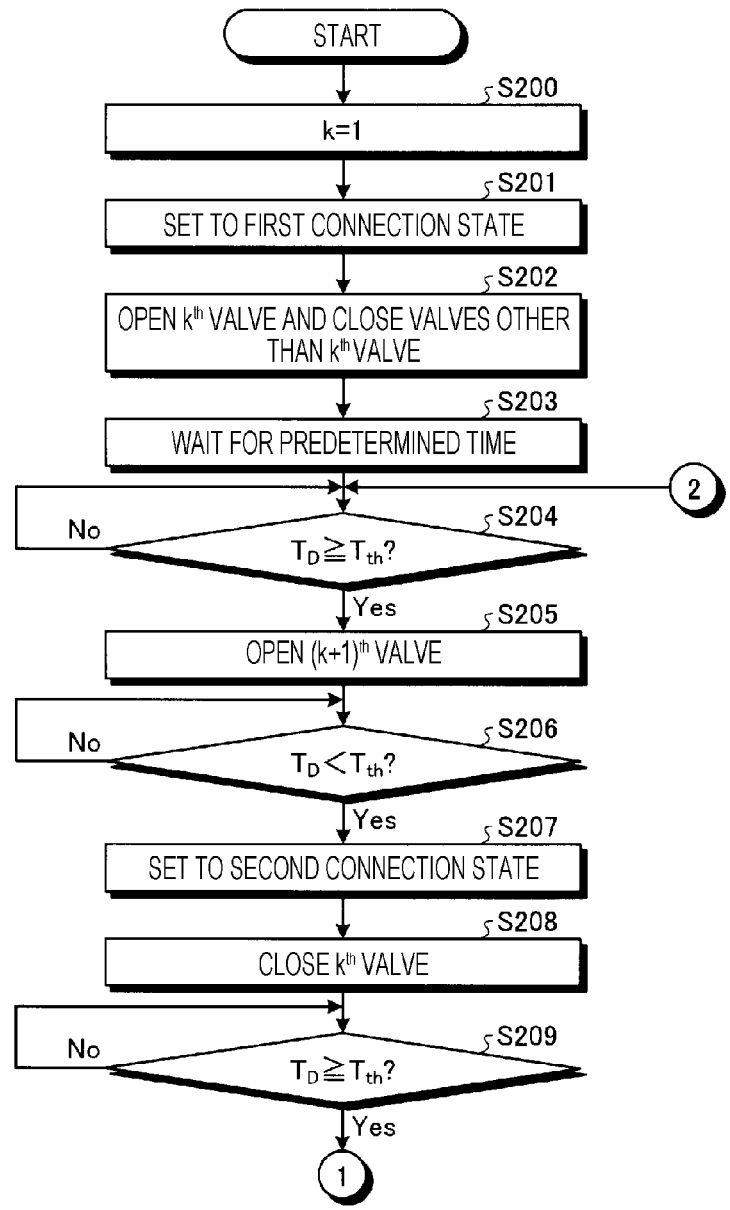
FIG. 9 is a flowchart illustrating an exemplary dry air generation method according to the second embodiment of the present disclosure.
Figure 10:
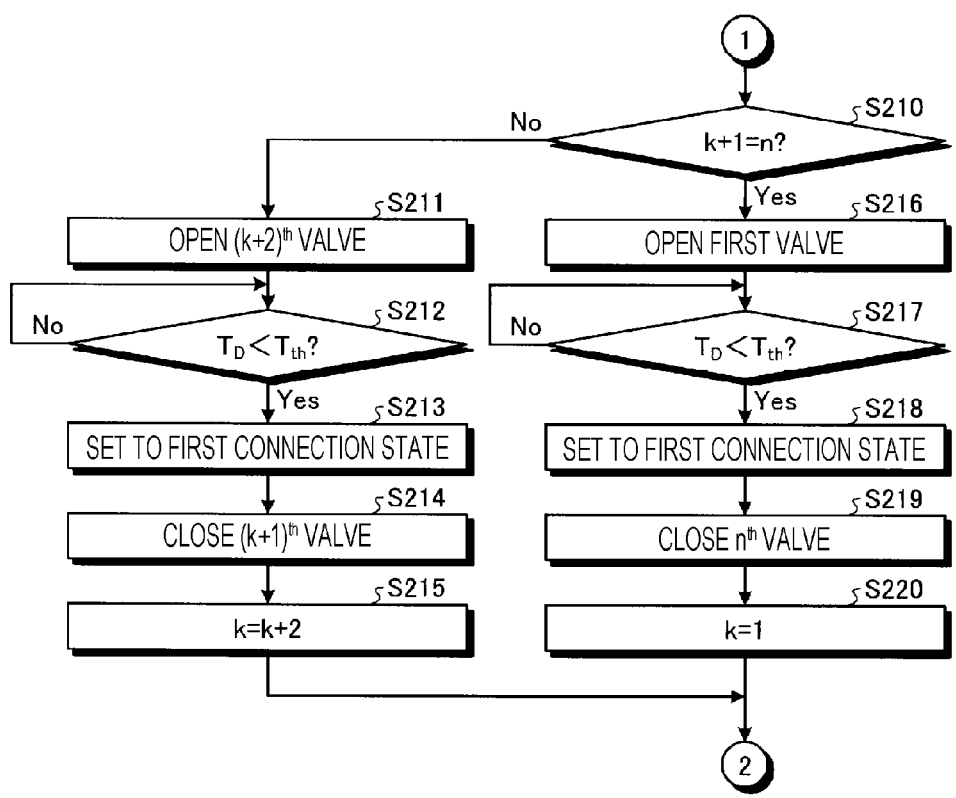
FIG. 10 is a flowchart illustrating an exemplary dry air generation method according to the second embodiment of the present disclosure.

FIGS. 9 and 10 are flowcharts illustrating an exemplary dry air generation method according to the second embodiment of the present disclosure. In the processings illustrated in the flowcharts of FIGS. 9 and 10 are controlled by the control device 11. In the following, the state of each valve will be described with reference to FIGS. 11 to 16. FIGS. 11 to 16 illustrate the air dryer 70 when n=4.

First, the control device 11 initializes variable k as 1 (S200). Then, the control device 11 controls the switching valve 75 to set the switching valve 75 to the first connection state (S201). Then, the control device 11 opens the $k^{th}$ (i.e., first) valve 780 and closes the valves 780 other than the $k^{th}$ valve 780 (S202). When the $k^{th}$ valve 78780 is opened, the coolant is supplied to the $k^{th}$ heat exchanger 77, and the $k^{th}$ heat exchanger 77 starts operation. Since the valves 780 other than $k^{th}$ valve 780 are closed, no coolant is supplied to the heat exchangers 77 other than the $k^{th}$ heat exchanger 77, and these heat exchangers 77-2 are stopped. Then, the control device 11 waits for a predetermined time until the heat exchange efficiency by the $k^{th}$ heat exchanger 77 is stabilized (S203).

Figure 11:
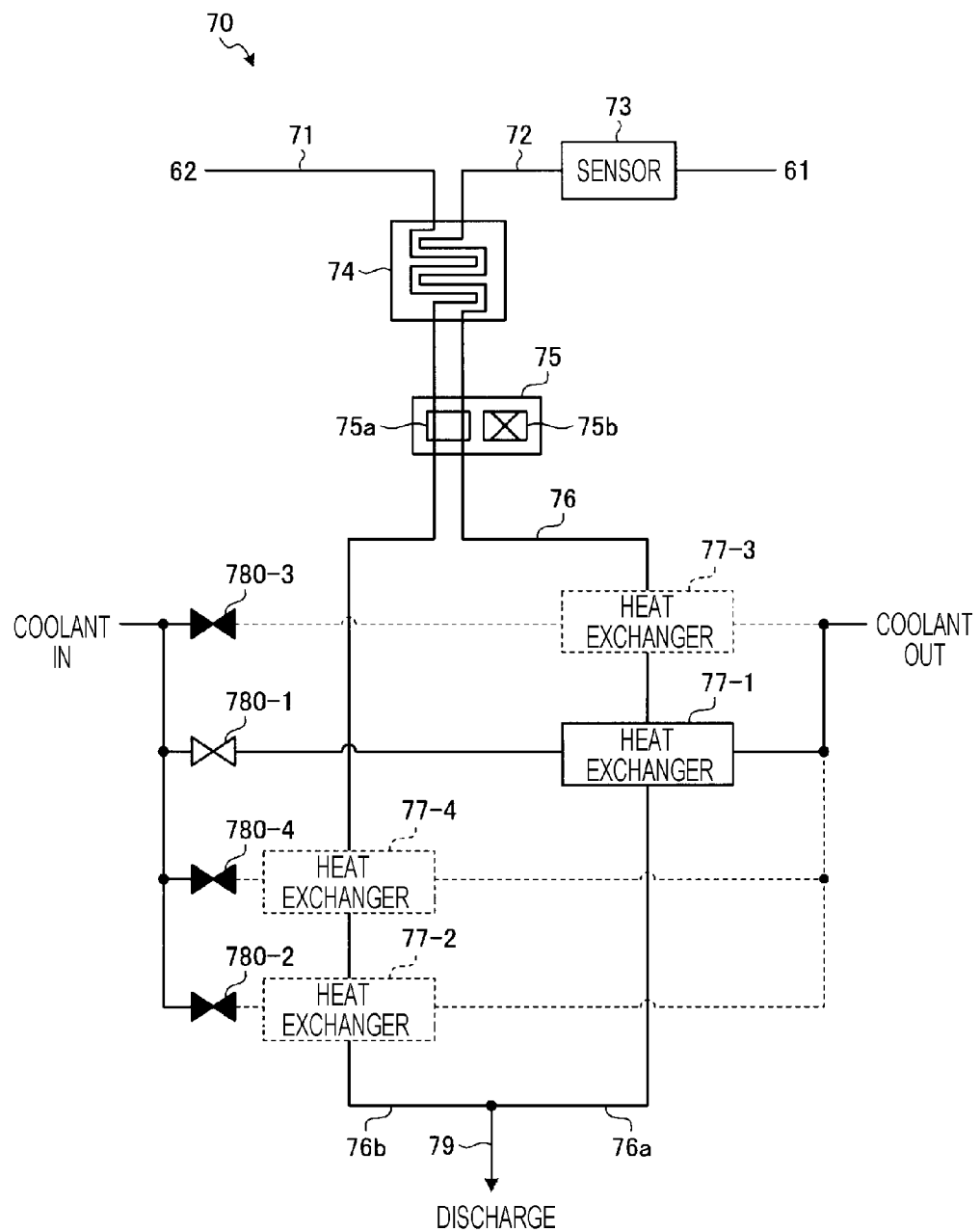
FIG. 11 is a view illustrating an exemplary state of each valve.

The state of each valve at this time is, for example, as illustrated in FIG. 11. The air supplied from the regulator 62 is supplied to the $k^{th}$ (the first in the example of FIG. 11) heat exchanger 77 through the pipe 71, the heat exchanger 74, the connection block 75a of the switching valve 75, and several other heat exchangers 77. Then, the air is cooled by the $k^{th}$ heat exchanger 77. Therefore, the moisture contained in the air is removed so that dry air is generated. The generated dry air flows to the heat exchanger 74 through the connection block 75a of the switching valve 75.

Next, the control device 11 determines whether or not the heat exchange efficiency of the $k^{th}$ heat exchanger 77 becomes equal to or lower than the predetermined heat exchange efficiency by determining whether or not the dew point temperature $T_D$ of the dry air measured by the sensor 73 becomes equal to or higher than a predetermined threshold value $T_{Th}$ (S204). When the dew point temperature $T_D$ is lower than the threshold value $T_{Th}$ (S204: No), the control device 11 executes the processing of step S204 again.

Figure 12:
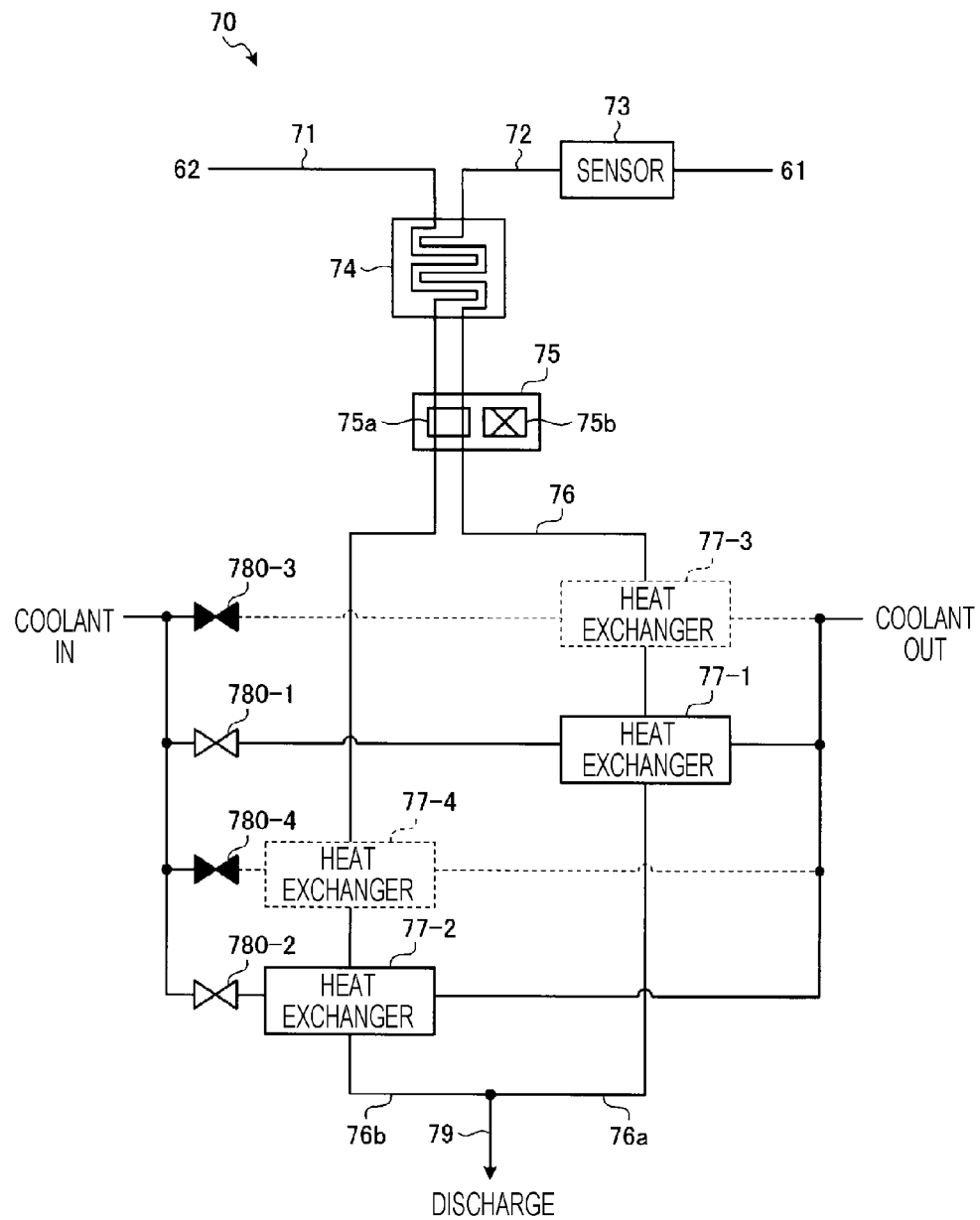
FIG. 12 is a view illustrating an exemplary state of each valve.

Meanwhile, when the dew point temperature $T_D$ becomes equal to or higher than the threshold value $T_{Th}$ (S204: Yes), that is, when the heat exchange efficiency of the $k^{th}$ heat exchanger 77 becomes equal to or lower than the predetermined efficiency, the control device 11 opens the $(k+1)^{th}$ valve 780 (S205). This makes the $(k+1)^{th}$ heat exchanger 77 starts operation. The state of each valve at this time is, for example, as illustrated in FIG. 12. In the example of FIG. 12, the $k^{th}$ (the first in the example of FIG. 12) and $(k+1)^{th}$ (the second in the example of FIG. 12) valves 780 are both opened, and the $k^{th}$ and $(k+1)^{th}$ heat exchangers 77 are both operating. When the $(k+1)^{th}$ heat exchanger 77 starts operation, the dew point temperature of the dry air flowing through the pipe 72 starts to decrease.

Next, the control device 11 determines whether or not the dew point temperature $T_D$ of the dry air measured by the sensor 73 is lower than the threshold value $T_{Th}$ (S206). When the dew point temperature $T_D$ is equal to or higher than the threshold value $T_{Th}$ (S206: No), the control device 11 executes the processing of step S206 again.

Meanwhile, when the dew point temperature $T_D$ is lower than the threshold value $T_{Th}$ (S206: Yes), the control device 11 controls the switching valve 75 to set the switching valve 75 to the second connection state (S207). Then, the control device 11 stops the $k^{th}$ heat exchanger 77 by closing the $k^{th}$ valve 780 (S208). Therefore, dry air is generated by the $(k+1)^{th}$ heat exchanger 77.

Figure 13:
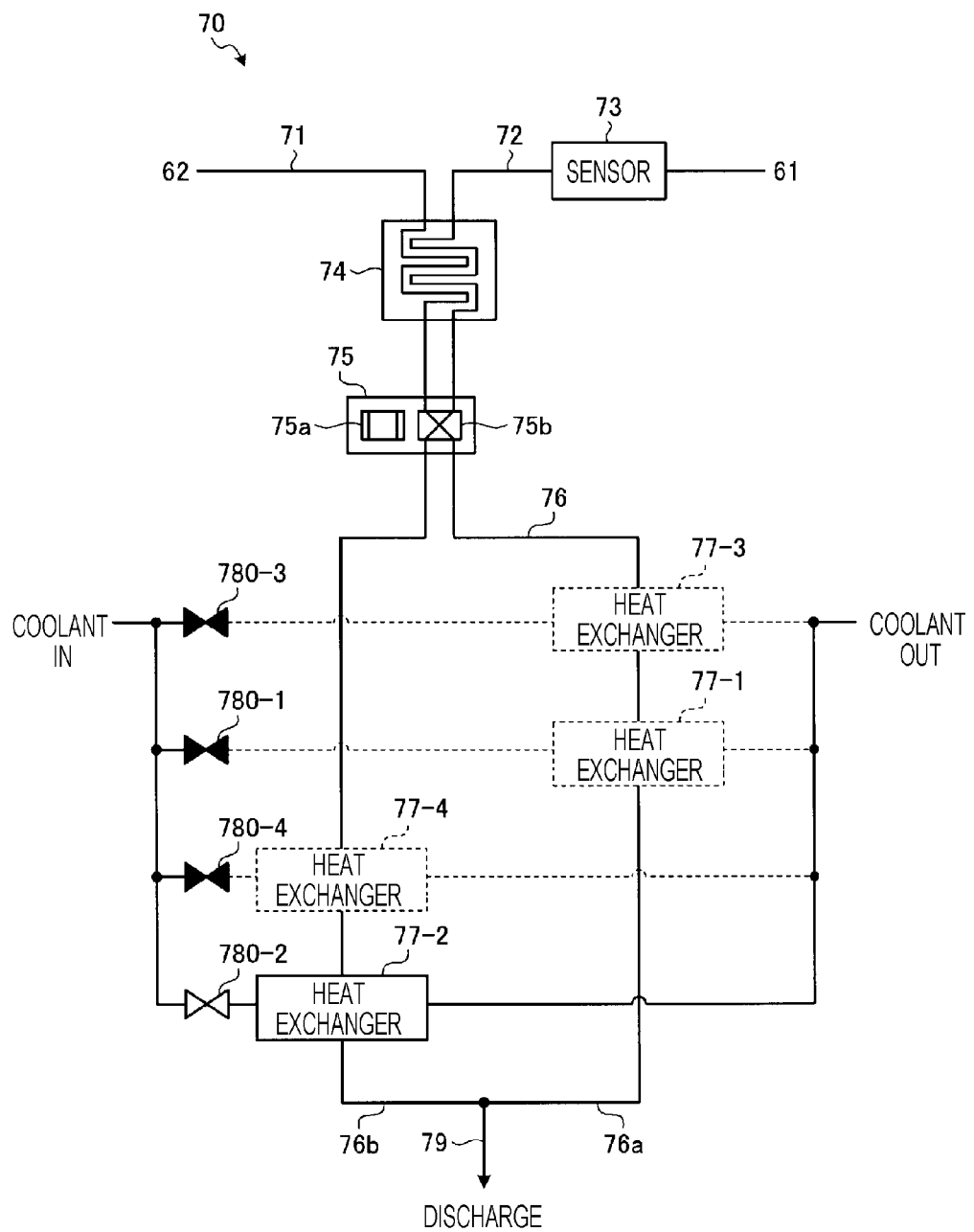
FIG. 13 is a view illustrating an exemplary state of each valve.

The state of each valve at this time is, for example, as illustrated in FIG. 13. When the switching valve 75 is set to the second connection state, the air supplied from the regulator 62 is supplied to the air flow path in the $k^{th}$ (the first in the example of FIG. 13) heat exchanger 77 before supplied to the air flow path in the $(k+1)^{th}$ (the second in the example of FIG. 13). Since the $k^{th}$ heat exchanger 77 is stopped, the room temperature air supplied from the regulator 62 melts the ice that has adhered to the air flow path in the $k^{th}$ heat exchanger 77 to form liquid water. The water that has become liquid in the air flow path in the $k^{th}$ heat exchanger 77 flows to the drain pipe 79 through the pipe 76 between the $k^{th}$ heat exchanger 77 and the $(k+1)^{th}$ heat exchanger 77, and is discharged from the drain pipe 79. This enables the heat exchange efficiency of the $k^{th}$ heat exchanger 77 to be recovered.

In addition, since the switching valve 75 is set to the second connection state, the dry air from which moisture has been removed by the $(k+1)^{th}$ heat exchanger 77 flows to the switching valve 75 through the pipe 76b between the $(k+1)^{th}$ heat exchanger 77 and the switching valve 75. Therefore, the liquid water that has flown from the air flow path in the $k^{th}$ heat exchanger 77 is discharged without coming into contact with the dry air generated by the $(k+1)^{th}$ heat exchanger 77. This enables the dew point temperature of the dry air generated by the $(k+1)^{th}$ heat exchanger 77 to be kept low.

Next, the control device 11 determines whether or not the heat exchange efficiency of the $(k+1)^{th}$ heat exchanger 77 becomes equal to or lower than the predetermined heat exchange efficiency by determining whether or not the dew point temperature $T_D$ of the dry air measured by the sensor 73 becomes equal to or higher than the threshold value $T_{Th}$ (S209). When the dew point temperature $T_D$ is lower than the threshold value $T_{Th}$ (S209: No), the control device 11 executes the processing of step S209 again.

Figure 14:
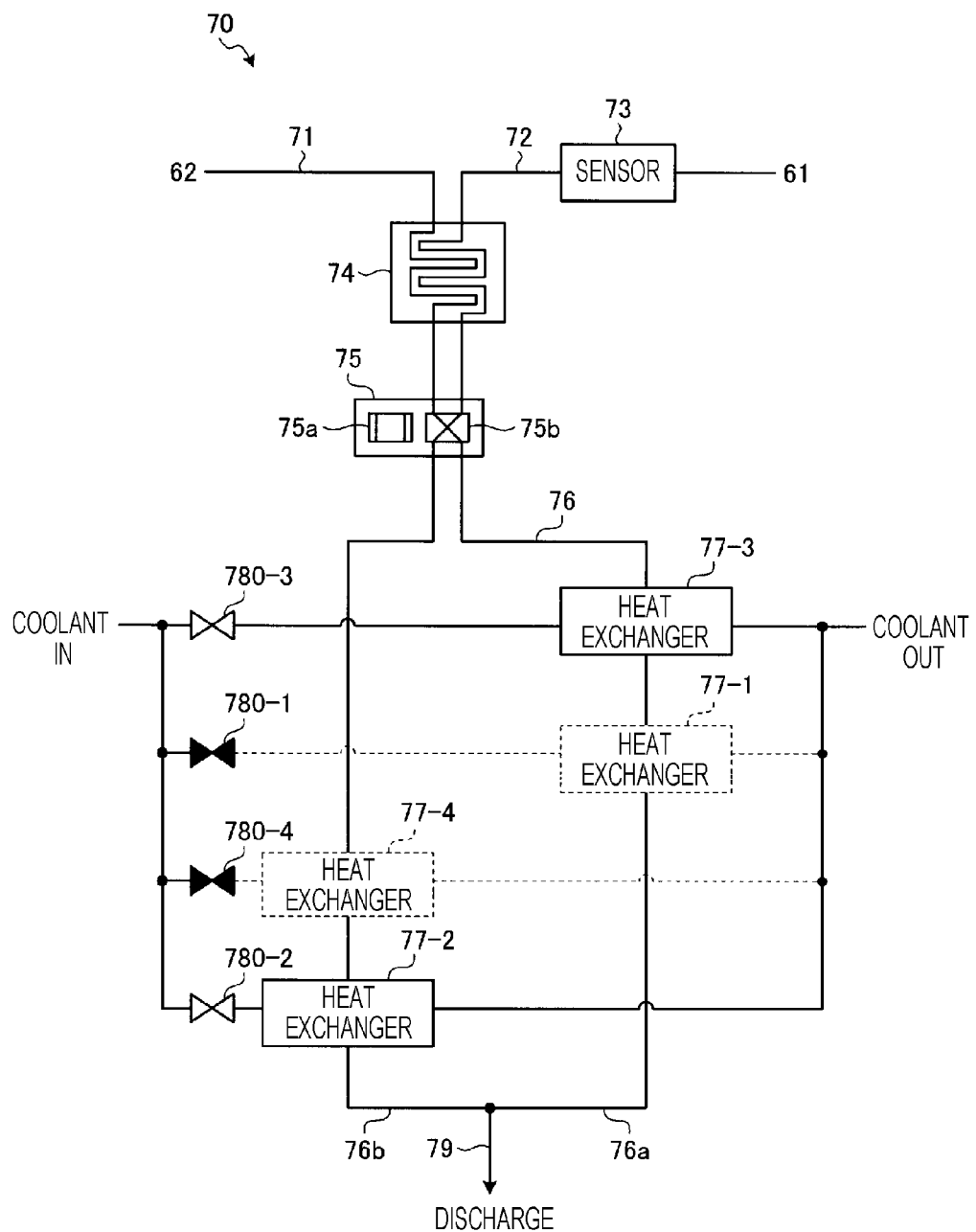
FIG. 14 is a view illustrating an exemplary state of each valve.

Meanwhile, when the dew point temperature $T_D$ becomes equal to or higher than the threshold value $T_{Th}$ (S209: Yes), that is, when the heat exchange efficiency of the $(k+1)^{th}$ heat exchanger 77 becomes equal to or lower than the predetermined efficiency, the control device 11 determines whether or not the value of $(k+1)$ is equal to the value of n (S210 in FIG. 10). When the value of $(k+1)$ is different from the value of n (S210: No), the control device 11 operates the $(k+2)^{th}$ heat exchanger 77 by opening the $(k+2)^{th}$ valve 780 (S211). Thus, the state of each valve becomes, for example, as illustrated in FIG. 14. In the example of FIG. 14, the $(k+1)^{th}$ (the second in the example of FIG. 14) and the $(k+2)^{th}$ (the second in the example of FIG. 14) valves 780 are both opened, and the $(k+1)^{th}$ and $(k+2)^{th}$ heat exchangers 77 are both operating. When the $(k+2)^{th}$ heat exchanger 77 starts operation, the dew point temperature of the dry air flowing through the pipe 72 starts to decrease again.

Next, the control device 11 determines whether or not the dew point temperature $T_D$ of the dry air measured by the sensor 73 is lower than the threshold value $T_{Th}$ (S212). When the dew point temperature $T_D$ is equal to or higher than the threshold value $T_{Th}$ (S212: No), the control device 11 executes the processing of step S212 again.

Meanwhile, when the dew point temperature $T_D$ is lower than the threshold value $T_{Th}$ (S212: Yes), the control device 11 controls the switching valve 75 to set the switching valve 75 to the first connection state (S213). Then, the control device 11 stops the $(k+1)^{th}$ heat exchanger 77 by closing the $(k+1)^{th}$ valve 780 (S214). Therefore, dry air is generated by the $(k+2)^{th}$ heat exchanger 77. In addition, the control device 11 increases the value of variable k by 2 (S215), and executes the processing of step S204 again.

Figure 15:
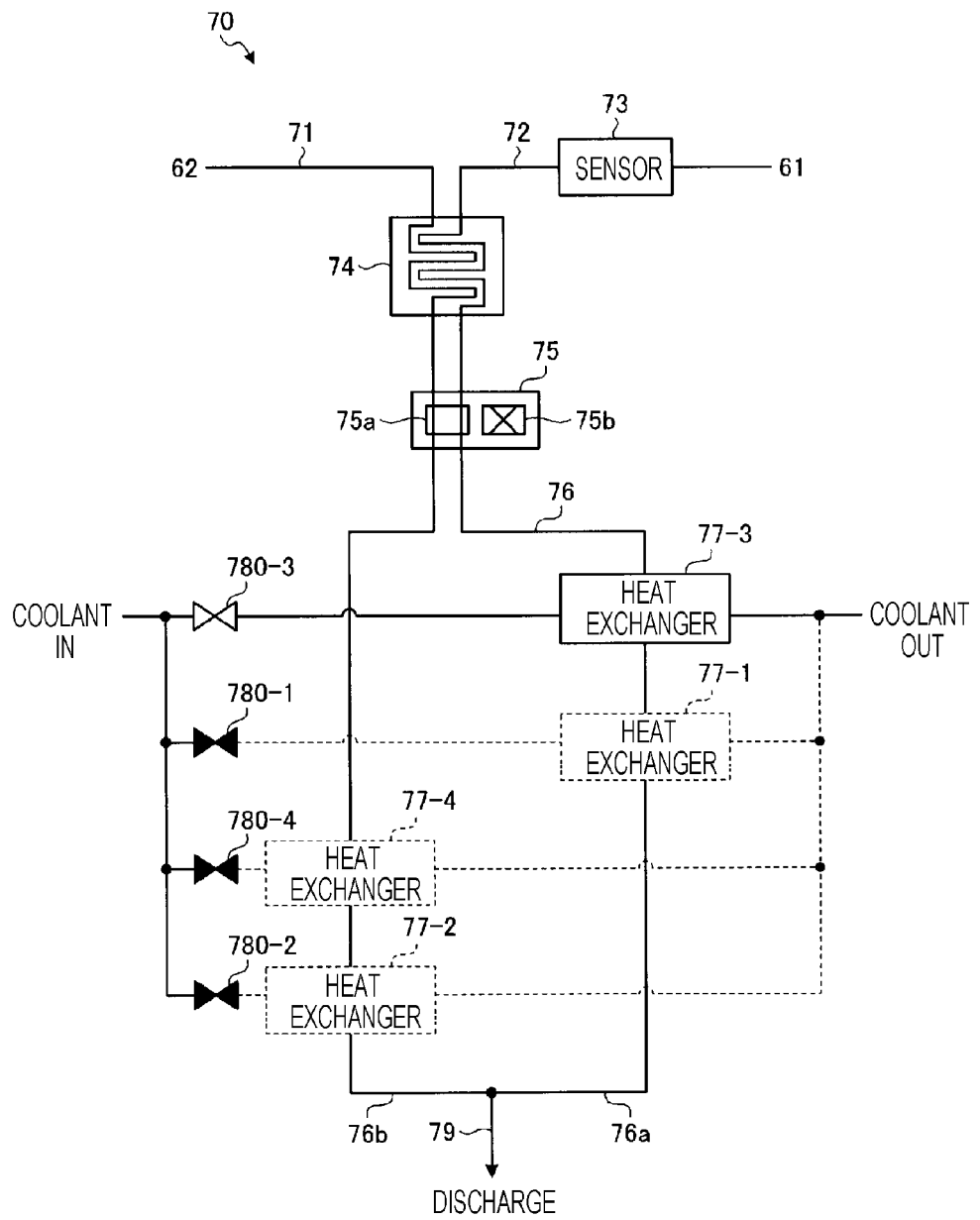
FIG. 15 is a view illustrating an exemplary state of each valve.

The state of each valve at this time is, for example, as illustrated in FIG. 15. By setting the switching valve 75 to the first connection state, the air supplied from the regulator 62 is supplied to the air flow path in the $(k+1)^{th}$ (the second in the example of FIG. 15) heat exchanger 77. Since the $(k+1)^{th}$ heat exchanger 77 is stopped, the room temperature air supplied from the regulator 62 melts the ice that has adhered to the $(k+1)^{th}$ air flow path in the heat exchanger 77 to form liquid water. The water that has become liquid in the air flow path in the $(k+1)^{th}$ heat exchanger 77 flows to the drain pipe 79 through the pipe 76 between the $(k+1)^{th}$ heat exchanger 77 and the $(k+2)^{th}$ heat exchanger 77, and is discharged from the drain pipe 79. This enables the heat exchange efficiency of the $(k+1)^{th}$ heat exchanger 77 to be recovered.

In addition, since the switching valve 75 is set to the first connection state, the dry air from which moisture has been removed by the $(k+2)^{th}$ heat exchanger 77 flows to the switching valve 75 through the pipe 76a between the $(k+2)^{th}$ heat exchanger 77 and the switching valve 75. Therefore, the liquid water that has flown from the air flow path in the $(k+1)^{th}$ heat exchanger 77 is discharged without coming into contact with the dry air generated by the $(k+2)^{th}$ heat exchanger 77. This enables the dew point temperature of the dry air generated by the $(k+2)^{th}$ heat exchanger 77 to be kept low.

Here, for example, in FIG. 15, when ice that has adhered to the air flow path in the $k^{th}$ (the first in the example of FIG. 15) heat exchanger 77 has not yet melted, water that has become liquid flows through the pipe 76a between the $k^{th}$ heat exchanger 77 and the drain pipe 79. In this embodiment, the odd-numbered heat exchangers 77 provided in the pipe 76a are selected in order from the side closer to the drain pipe 79, and the even-numbered heat exchangers 77 provided in the pipe 76 b are also selected in order from the side closer to the drain pipe 79. Therefore, the dry air generated by the $(k+3)^{th}$ (the third in the example of FIG. 15) heat exchanger 77 is discharged without coming into contact with the water flowing through the pipe 76a between the $k^{th}$ heat exchanger 77 and the drain pipe 79. This enables the dew point temperature of the dry air generated by the $(k+2)^{th}$ heat exchanger 77 to be kept low.

Figure 16:
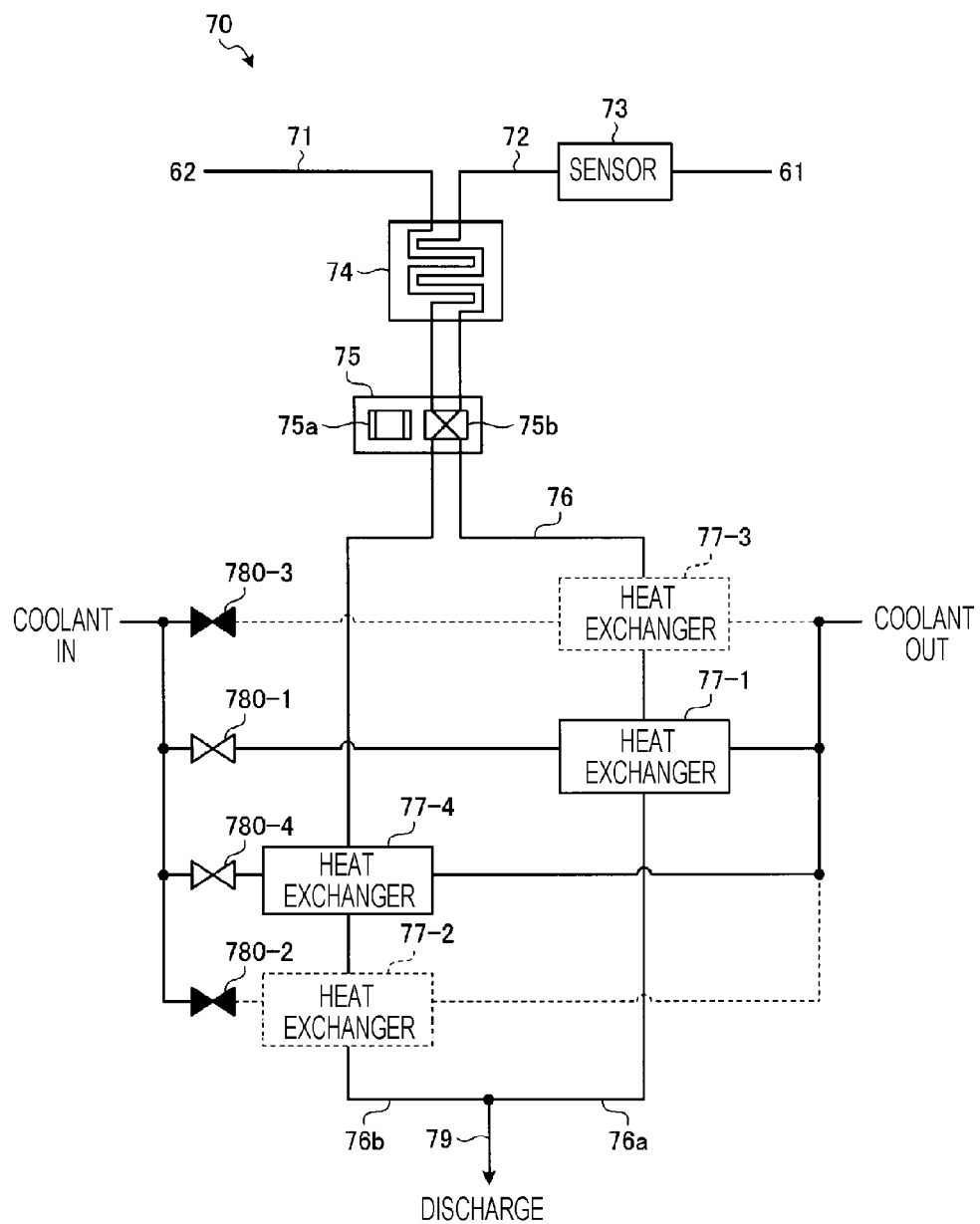
FIG. 16 is a view illustrating an exemplary state of each valve.

When the value of $(k+1)$ is equal to the value of n (S210: Yes), the control device 11 operates the first heat exchanger 77 by opening the first valve 780 (S216). Thus, the state of each valve becomes, for example, as illustrated in FIG. 16. In the example of FIG. 16, the $n^{th}$ (the fourth in the example of FIG. 16) and first valves 780 are both opened, and the $n^{th}$ and first heat exchangers 77 are both operating. When the first heat exchanger 77 starts operation, the dew point temperature of the dry air flowing through the pipe 72 starts to decrease again.

Next, the control device 11 determines whether or not the dew point temperature $T_D$ of the dry air measured by the sensor 73 is lower than the threshold value $T_{Th}$ (S217). When the dew point temperature $T_D$ is equal to or higher than the threshold value $T_{Th}$ (S217: No), the control device 11 executes the processing of step S217 again.

Meanwhile, when the dew point temperature $T_D$ is lower than the threshold value $T_{Th}$ (S217: Yes), the control device 11 controls the switching valve 75 to set the switching valve 75 to the first connection state (S218). Then, the control device 11 stops the $n^{th}$ heat exchanger 77 by closing the $n^{th}$ valve 780 (S219). Therefore, dry air is generated by the first heat exchanger 77. In addition, the control device 11 sets 1 as the value of variable k by 1 (S220), and executes the processing of step S204 again.

The state of each valve at this time is, for example, as illustrated in FIG. 11. By setting the switching valve 75 to the first connection state, the air supplied from the regulator 62 is supplied to the air flow path in the $n^{th}$ (the fourth in the example of FIG. 11) heat exchanger 77. Since the $n^{th}$ heat exchanger 77 is stopped, the air supplied from the regulator 62 melts the ice that has adhered to the air flow path in the $n^{th}$ heat exchanger 77 to form liquid water. The water that has become liquid in the air flow path in the $n^{th}$ heat exchanger 77 flows to the drain pipe 79 through the pipe 76 between the $n^{th}$ heat exchanger 77 and the first heat exchanger 77, and is discharged from the drain pipe 79. This enables the heat exchange efficiency of the $n^{th}$ heat exchanger 77 to be recovered.

In addition, since the switching valve 75 is set to the first connection state, the dry air from which moisture has been removed by the first heat exchanger 77 flows to the switching valve 75 through the pipe 76a between the first heat exchanger 77 and the switching valve 75. Therefore, the liquid water that has flown from the air flow path in the $n^{th}$ heat exchanger 77 is discharged without coming into contact with the dry air generated by the first heat exchanger 77. This enables the dew point temperature of the dry air generated by the first heat exchanger 77 to be kept low.

The substrate processing system 1 in the second embodiment has been described above. The air dryer 70 in this embodiment includes n heat exchangers 77. The n heat exchangers 77 include a first heat exchanger and a second heat exchanger and are provided in the air flow path, and the moisture contained in air is removed by cooling the air which flows through the flow path to 0° C. or lower. The n heat exchangers 77 are connected in series in the flow path. In the state where the $k^{th}$ heat exchanger 77 is operating and the (n−1) heat exchangers 77 other than the $k^{th}$ heat exchanger 77 are stopped, when the heat exchange efficiency of the $k^{th}$ heat exchanger 77 becomes equal to or lower than predetermined efficiency, the control device 11 stops the $k^{th}$ heat exchanger 77 and operates the $(k+1)^{th}$ heat exchanger 77. In addition, in the state where the $n^{th}$ heat exchanger 77 is operating and the (n−1) heat exchangers 77 other than the $n^{th}$ heat exchanger 77 are stopped, when the heat exchange efficiency of the $n^{th}$ heater exchanger 77 becomes equal to or lower than predetermined efficiency, the control device 11 stops the $n^{th}$ heat exchanger 77 and operates the first heat exchanger 77. Thus, in each of the heat exchangers 77, even when the time required for recovery of the heat exchange efficiency is longer than the time required for the reduction of the heat exchange efficiency, it is possible to continuously generate dry air.

[Others]

The technique disclosed herein is not limited to the above-described embodiments, and various modifications are possible within the scope of the gist thereof.

For example, in the first embodiment and the second embodiment described above, it is determined whether or not the heat exchange efficiency of the heat exchanger 77 is equal to or lower than predetermined efficiency based on the dew point temperature of the dry air flowing in the pipe 72, but the technique disclosed herein is not limited thereto. When the heat exchange efficiency of the heat exchanger 77 is reduced, the temperature of the dry air flowing through the pipe 72 is raised. Accordingly, for example, a temperature sensor may be provided in the pipe 72 as the sensor 73, and it may be determined whether or not the heat exchange efficiency of the heat exchanger is equal to or lower than predetermined efficiency based on whether or not the temperature of the dry air flowing in the pipe 72 is equal to or higher than a predetermined temperature. Even in this case, it is possible to keep the dew point temperature of the dry air generated by the air dryer 70 below a predetermined value.

In addition, when ice adheres to the air flow path, the air flow path becomes narrower, and the pressure in the pipe 71 on the air inlet side increases. Accordingly, for example, a temperature sensor may be provided in the pipe 72, and it may be determined whether or not the heat exchange efficiency of the heat exchanger is equal to or lower than predetermined efficiency based on whether or not the pressure of the dry air flowing in the pipe 71 is equal to or higher than a predetermined pressure. Even in this case, it is possible to keep the dew point temperature of the dry air generated by the air dryer 70 below a predetermined value.

In addition, in the heat exchanger 77-1 and the heat exchanger 77-2 in the first embodiment described above, the supply of the coolant is stopped when the heat exchange efficiency is reduced, and the room temperature air supplied from the regulator 62 melts the ice adhering to the air flow path. However, the technology disclosed herein is not limited thereto. For example, each of the heat exchanger 77-1 and the heat exchanger 77-2 is provided with a heating mechanism such as, for example, a heater, and when the heat exchange efficiency is reduced, ice that has adhered to the air flow path may be melted by the heating mechanism. This enables the heat exchange efficiency reduced by the adhesion of ice to be quickly recovered.

In the air dryer 70 according to the second embodiment described above, any one heat exchanger 77 among the n heat exchangers 77 is operated in order, but two or more heat exchangers 77 may be operated in order.

In the first embodiment and the second embodiment described above, dry air supplied to a member having a temperature lower than room temperature is generated in the substrate processing apparatus 10 that performs etching using plasma, but the technique disclosed herein is not limited thereto. For example, the technique disclosed therein is also applicable to a film forming apparatus or a modification apparatus that has a member that has a temperature lower than room temperature and at least partially comes into contact with the outside air.

According to various aspects and embodiments of the present disclosure, it is possible to continuously generate dry air having a dew point temperature of 0° C. or lower.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A dry air generation apparatus comprising:
   a first heat exchanger and a second heat exchanger provided in an air flow path, and each configured to cool air flowing in the air flow path to 0° C. or lower, thereby removing moisture contained in the air;
   a switching valve configured to switch a direction of air flowing in the first heat exchanger and the second heat exchanger;
   a first pipe connected to an air inlet;
   a second pipe connected to an air outlet; and
   a controller configured to control the first heat exchanger, the second heat exchanger, and the switching valve,
   wherein the first heat exchanger and the second heat exchanger are connected in series in the air flow path,
   the switching valve is provided between a side of the first pipe and the second pipe and a side of one end of the air flow path and a remaining end of the air flow path,
   the first heat exchanger is provided on the side of the one end of the air flow path, and
   the second heat exchanger is provided on the side of the remaining end of the air flow path,
   wherein the controller is configured to:
   stop the first heat exchanger after a predetermined time elapses after the second heat exchanger is operated when heat exchange efficiency of the first heat exchanger becomes equal to or lower than a predetermined efficiency,
   stop the second heat exchanger after a predetermined time elapses after the first heat exchanger is operated when heat exchange efficiency of the second heat exchanger becomes equal to or lower than the predetermined efficiency,
   control the switching valve to connect the first pipe to the remaining end of the air flow path and to connect the second pipe to the one end of the air flow path when operating the first heat exchanger and stopping the second heat exchanger, and
   control the switching valve to connect the first pipe to the one end of the air flow path and to connect the second pipe to the remaining end of the air flow path when stopping the first heat exchanger and operating the second heat exchanger.

2. The dry air generation apparatus of claim 1, further comprising:
   a third heat exchanger configured to perform heat exchange between air flowing in the first pipe and air flowing in the second pipe.

3. The dry air generation apparatus of claim 1, further comprising:
   a sensor configured to measure a dew point temperature of air flowing in the second pipe,
   wherein the controller is configured to:
   determine that the heat exchange efficiency of the first heat exchanger becomes equal to or lower than the predetermined efficiency when the dew point temperature measured by the sensor is equal to or higher than a predetermined temperature in a state where the first heat exchanger is operated and the second heat exchanger is stopped; and
   determine that the heat exchange efficiency of the second heat exchanger becomes equal to or lower than the predetermined efficiency when the dew point temperature measured by the sensor is equal to or higher than a predetermined temperature in a state where the first heat exchanger is stopped and the second heat exchanger is operated.

4. The dry air generation apparatus of claim 2, further comprising:
   a sensor configured to measure a dew point temperature of air flowing in the second pipe,
   wherein the controller is configured to:
   determine that the heat exchange efficiency of the first heat exchanger becomes equal to or lower than the predetermined efficiency when the dew point temperature measured by the sensor is equal to or higher than a predetermined temperature in a state where the first heat exchanger is operated and the second heat exchanger is stopped; and
   determine that the heat exchange efficiency of the second heat exchanger becomes equal to or lower than the predetermined efficiency when the dew point temperature measured by the sensor is equal to or higher than a predetermined temperature in a state where the first heat exchanger is stopped and the second heat exchanger is operated.

5. The dry air generation apparatus of claim 1, further comprising:
   a sensor configured to measure a temperature of air flowing in the second pipe,
   wherein the controller is configured to:
   determine that the heat exchange efficiency of the first heat exchanger becomes equal to or lower than the predetermined efficiency when the temperature measured by the sensor is equal to or higher than a predetermined temperature in a state where the first heat exchanger is operated and the second heat exchanger is stopped; and
   determine that the heat exchange efficiency of the second heat exchanger becomes equal to or lower than the predetermined efficiency when the temperature measured by the sensor is equal to or higher than a predetermined temperature in a state where the first heat exchanger is stopped and the second heat exchanger is operated.

6. The dry air generation apparatus of claim 2, further comprising:
   a sensor configured to measure a temperature of air flowing in the second pipe,
   wherein the controller is configured to:
   determine that the heat exchange efficiency of the first heat exchanger becomes equal to or lower than the predetermined efficiency when the temperature measured by the sensor is equal to or higher than a predetermined temperature in a state where the first heat exchanger is operated and the second heat exchanger is stopped; and
   determine that the heat exchange efficiency of the second heat exchanger becomes equal to or lower than the predetermined efficiency when the temperature measured by the sensor is equal to or higher than a predetermined temperature in a state were the first heat exchanger is stopped and the second heat exchanger is operated.

7. The dry air generation apparatus of claim 1, further comprising:
   a sensor configured to measure a pressure of air flowing in the first pipe,
   wherein the controller is configured to:
   determine that the heat exchange efficiency of the first heat exchanger becomes equal to or lower than the predetermined efficiency when the pressure measured by the sensor is equal to or higher than a predetermined pressure in a state where the first heat exchanger is operated and the second heat exchanger is stopped; and determine that the heat exchange efficiency of the second heat exchanger becomes equal to or lower than the predetermined efficiency when the pressure measured by the sensor is equal to or higher than a predetermined pressure in a state where the first heat exchanger is stopped and the second heat exchanger is operated.

8. The dry air generation apparatus of claim 2, further comprising:

a sensor configured to measure a pressure of air flowing in the first pipe, wherein the controller is configured to:

determine that the heat exchange efficiency of the first heat exchanger becomes equal to or lower than the predetermined efficiency when the pressure measured by the sensor is equal to or higher than a predetermined pressure in a state where the first heat exchanger is operated and the second heat exchanger is stopped; and determine that the heat exchange efficiency of the second heat exchanger becomes equal to or lower than the predetermined efficiency when the pressure measured by the sensor is equal to or higher than a predetermined pressure in a state where the first heat exchanger is stopped and the second heat exchanger is operated.

9. The dry air generation apparatus of claim 1, further comprising:

a drain pipe connected to the air flow path between the first heat exchanger and the second heat exchanger, and configured to discharge moisture removed from the air by the first heat exchanger and the second heat exchanger, wherein the first heat exchanger and the second heat exchanger are disposed at a position higher than the drain pipe.

10. The dry air generation apparatus of claim 1, wherein 'n' heat exchangers including the first heat exchanger and the second heat exchanger are provided in the air flow path, the 'n' heat exchangers being configured to cool air flowing in the air flow path to 0° C. or lower, thereby removing the moisture contained in the air, wherein the 'n' is an integer of 2 or more, and the 'n' heat exchangers are connected in series in the air flow path, and wherein the controller is configured to:

in a state where a $k^{th}$ heat exchanger is operated and (n−1) heat exchangers other than the $k^{th}$ heat exchanger is stopped, stop the $k^{th}$ heat exchanger and operate a $(k+1)^{th}$ heat exchanger when heat exchange efficiency of the $k^{th}$ heat exchanger becomes equal to or lower than predetermined efficiency, wherein the 'k' is an integer of 1 to n; and in a state where an $n^{th}$ heat exchanger is operated and (n−1) heat exchangers other than the $n^{th}$ heat exchanger is stopped, stop the $n^{th}$ heat exchanger and operate the first heat exchanger when heat exchange efficiency of the $n^{th}$ heat exchanger becomes equal to or lower than predetermined efficiency.

11. A dry air generation method comprising:

providing a dry air generation apparatus including:

a first heat exchanger and a second heat exchanger provided in an air flow path, and configured to cool air flowing in the air flow path to 0° C. or lower, thereby removing moisture contained in the air;

a switching valve configured to switch a direction of air flowing in the first heat exchanger and the second heat exchanger;

a first pipe connected to an air inlet;

a second pipe connected to an air outlet; and a controller configured to control the first heat exchanger, the second heat exchanger, and the switching valve, wherein the first heat exchanger and the second heat exchanger are connected in series in the air flow path, the switching valve is provided between a side of the first pipe and the second pipe and a side of one end of the air flow path and a remaining end of the air flow path, the first heat exchanger is provided on the side of the one end of the air flow path, and the second heat exchanger is provided on the side of the remaining end of the air flow path, operating the second heat exchanger and stopping the first heat exchanger by the controller when a heat exchange efficiency of the first heat exchanger becomes equal to or lower than a predetermined efficiency in a state where the first heat exchanger is operated and the second heat exchanger is stopped;

operating the first heat exchanger and stopping the second heat exchanger by the controller, when the heat exchange efficiency of the second heat exchanger becomes equal to or lower than the predetermined efficiency in a state where the first heat exchanger is stopped and the second heat exchanger is operated;

controlling, by the controller, the switching valve to connect the first pipe to the remaining end of the air flow path and to connect the second pipe to the one end of the air flow path when operating the first heat exchanger and stopping the second heat exchanger; and controlling, by the controller, the switching valve to connect the first pipe to the one end of the air flow path and to connect the second pipe to the remaining end of the air flow path when stopping the first heat exchanger and operating the second heat exchanger.

12. A substrate processing system comprising:

a low-temperature plate provided in a substrate processing apparatus that processes a substrate and having a temperature lower than room temperature;

a support that surrounds at least a portion of the low-temperature plate to form a space;

a dry air generation apparatus configured to generate a dry air; and a flow rate controller provided between the dry air generation apparatus and the space, and connected to the space by a pipe, the flow rate controller being configured to control a flow rate of the dry air generated by the dry air generation apparatus and supply the dry air into the space through the pipe, wherein the dry air generation apparatus includes:

a first heat exchanger and a second heat exchanger provided in an air flow path, and configured to cool air flowing in the air flow path to 0° C. or lower, thereby removing moisture contained in the air;

a switching valve configured to switch a direction of air flowing in the first heat exchanger and the second heat exchanger;

a first pipe connected to an air inlet;
a second pipe connected to an air outlet; and
a controller configured to control the first heat exchanger, the second heat exchanger, and the switching valve,
wherein the first heat exchanger and the second heat exchanger are connected in series in the air flow path,
the switching valve is provided between a side of the first pipe and the second pipe and a side of one end of the air flow path and a remaining end of the air flow path,
the first heat exchanger is provided on the side of the one end of the air flow path, and the second heat exchanger is provided on the side of the remaining end of the air flow path,
wherein the controller is configured to:
stop the first heat exchanger after a predetermined time elapses after the second heat exchanger is operated when heat exchange efficiency of the first heat exchanger becomes equal to or lower than a predetermined efficiency,
stop the second heat exchanger after a predetermined time elapses after the first heat exchanger is operated when heat exchange efficiency of the second heat exchanger becomes equal to or lower than the predetermined efficiency,
control the switching valve to connect the first pipe to the remaining end of the air flow path and to connect the second pipe to the one end of the air flow path when operating the first heat exchanger and stopping the second heat exchanger, and
control the switching valve to connect the first pipe to the one end of the air flow path and to connect the second pipe to the remaining end of the air flow path when stopping the first heat exchanger and operating the second heat exchanger.

* * * * *